United States Patent
Yoshizawa et al.

[11] Patent Number: 6,132,588
[45] Date of Patent: Oct. 17, 2000

[54] METHOD FOR PLATING INDEPENDENT CONDUCTOR CIRCUIT

[75] Inventors: Izuru Yoshizawa; Hiroaki Takahashi; Tomoyuki Kawahara, all of Kadoma, Japan

[73] Assignee: Matsushita Electric Works, Ltd., Osaka, Japan

[21] Appl. No.: 09/051,265

[22] PCT Filed: Aug. 7, 1997

[86] PCT No.: PCT/JP97/02769

§ 371 Date: Apr. 2, 1998

§ 102(e) Date: Apr. 2, 1998

[87] PCT Pub. No.: WO98/07302

PCT Pub. Date: Feb. 19, 1998

[30] Foreign Application Priority Data

Aug. 9, 1996 [JP] Japan .................................. 8-211701
Oct. 22, 1996 [JP] Japan .................................. 8-279109

[51] Int. Cl.[7] .................................................. C25D 5/02
[52] U.S. Cl. ........................................... 205/125; 205/135
[58] Field of Search .................................. 205/125, 122, 205/135, 158, 183

[56] References Cited

U.S. PATENT DOCUMENTS

| | | | |
|---|---|---|---|
| 4,666,818 | 5/1987 | Lake et al. .............................. | 430/256 |
| 4,897,338 | 1/1990 | Spicciati et al. ........................ | 430/314 |
| 4,921,777 | 5/1990 | Fraenkel ................................. | 430/314 |
| 4,988,412 | 1/1991 | Liu et al. ................................ | 204/15 |
| 5,106,461 | 4/1992 | Volfson et al. ......................... | 205/125 |
| 5,137,618 | 8/1992 | Burnett et al. .......................... | 205/125 |
| 5,183,552 | 2/1993 | Bressel et al. .......................... | 205/158 |
| 5,209,817 | 5/1993 | Ahmad et al. .......................... | 156/643 |
| 5,252,195 | 10/1993 | Kobayashi et al. ..................... | 205/126 |
| 5,458,763 | 10/1995 | Kobayashi et al. ..................... | 205/104 |
| 5,725,807 | 3/1998 | Thorn et al. ............................ | 252/510 |
| 5,863,405 | 1/1999 | Miyashita ............................... | 205/125 |
| 5,869,126 | 2/1999 | Kukanskis ............................... | 427/97 |

*Primary Examiner*—Kathryn Gorgos
*Assistant Examiner*—Erica Smith-Hicks
*Attorney, Agent, or Firm*—Lynn & Lynn

[57] ABSTRACT

In wiring circuit board having fine and isolated conductor circuit pattern, a metal deposit coat is formed at desired position on the isolated conductor circuit pattern without damaging conductor circuit of the pattern, as an object of the invention. An electrically conducting layer consisting of a material electrically conducting and peelable with one of heat, solvent and alkali is formed on the wiring circuit board so as to be at least in contact with the isolated conductor circuit pattern on which the deposit coat is to be formed, a peelable protect layer is formed to be superposed on the electrically conducting layer at least at other portions than the portion where the deposit coat is to be formed, a metal deposition is performed on the portion not coated with the protect layer by means of an electroplating with the electrically conducting layer used as a power supply layer, and the electrically conducting and protect layers left on the wiring circuit board are peeled off.

18 Claims, 19 Drawing Sheets

(a)

(b)

METHOD FOR PLATING INDEPENDENT CONDUCTOR CIRCUIT

TECHNICAL BACKGROUND OF THE INVENTION

This invention relates to a process for forming a deposit layer on an isolated conductor circuit pattern of wiring circuit boards employed in the field of electronic material.

DISCLOSURE OF PRIOR ART

In recent years, technology has rapidly progressed in dimensional minimization of electronic equipment, however there still exists an increased demand for a higher mounting density Additionally there is demand for a process to form a fine isolated conductor circuit pattern of a wiring circuit board and further a need for a method of forming a deposit coat layer on only a part of the fine isolated conductor circuit pattern.

In forming the bumps, it has been generally known that, for example, other portions than the desired bump forming portions are coated with a resist to the plating, thereafter an electroplating is performed, and then the resist is peeled off to obtain the bumps.

In the case of forming the bumps in the wiring circuit board having the fine and isolated conductor pattern by means of the conventional electroplating process, however, it has been required to have a dummy conductor circuit pattern for a power supply to the bump forming portions, and there have been such defects that the necessary conductor circuit pattern is subjected to a side etching to cause a risk of wire breakage to arise upon etching-removal of the dummy conductor circuit pattern after the bump formation or, in an event where such metal as Sn is used for forming the bumps, there is a risk that Sn itself is excessively damaged upon etching off the dummy conductor circuit pattern.

DESCRIPTION OF THE INVENTION present invention has been suggested to overcome the foregoing problems, and its object is to provide a process of plating on isolated conductor circuit, which process being capable of forming a metal deposit coat at desired positions on the isolated conductor circuit pattern without giving to the necessary conductor circuit pattern any damage, in the wiring circuit board having the fine and isolated conductor circuit pattern.

In order to establish the foregoing object, the process of plating on the isolated circuit in an optimum embodiment of the present invention is a process of plating on the isolated conductor circuit pattern of the wiring circuit board through the electroplating, characterized in comprising the steps of forming on the wiring circuit board an electrically conducting layer with a material electrically conductive and peelable with any one of heat, solvent and alkali, so as to be at least in contact with the isolated conductor circuit pattern requiring the formation of the deposit coat, forming a protect layer such as a peelable plating resist layer at least at other portions than those requiring the formation of the deposit coat and to be superposed on the electrically conducting layer, depositing a metal at the portions where the protect layer is not formed through an electroplating with the electrically conducting layer used as a power supply layer, and peeling off the electrically conducting layer and protect layer left on the wiring circuit board.

In this case, it is possible to form the deposit coat on the isolated conductor circuit pattern through the electroplating while supplying the power through the electrically conducting layer without employing the conventional dummy conductor circuit, and further the electrically conducting layer can be peeled off by means of heat, solvent or alkali, without requiring any etching by means of such strong acid or the like as required for the conventional dummy conductor, so that the required conductor circuit pattern can be prevented from being damaged, and the desired deposit coat can be stably formed.

Other objects and advantages of the present invention shall be made clear in the following description detailed with reference to embodiments shown in accompanying drawings.

BEST MODE FOR WORKING THE INVENTION

Figure 1:
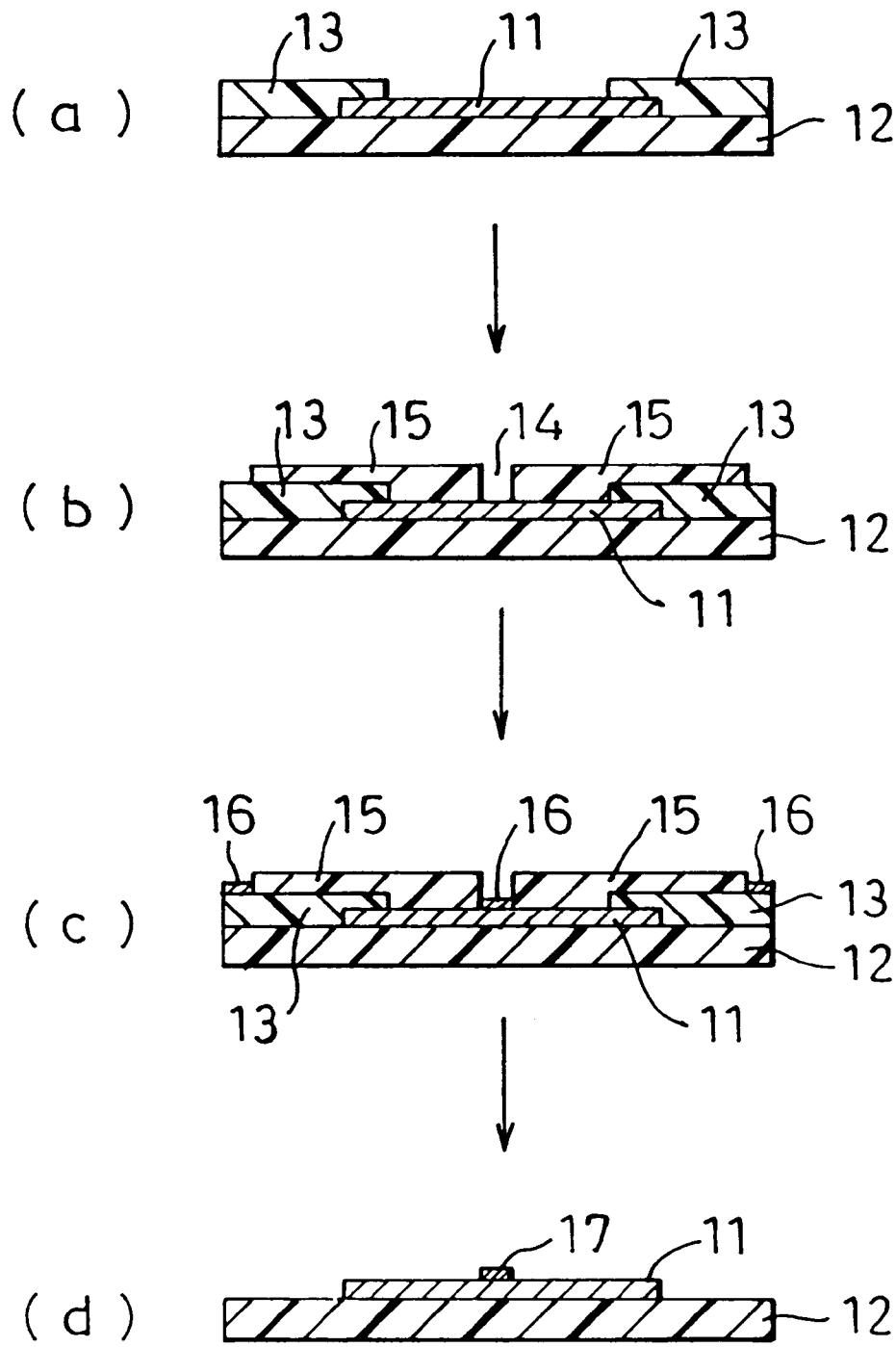
FIGS. 1(a) to 1(d) show in sectioned views respective steps of plating on the isolated circuit in an embodiment according to the present invention.

The optimum embodiments of the present invention shall now be described in the followings as detailed with reference to schematic step diagrams shown in FIGS. 1–3. In the process of plating on an isolated conductor circuit according to the present invention, an electrically conducting layer 13 is first formed as shown in FIGS. 1(a), 2(a) and 3(a) on a wiring circuit board 12 so that the layer 13 will be at least in contact with an isolated conductor circuit pattern 11 on which a deposit coat is required to be formed.

For the wiring circuit board 12 to be employed here, there are plastic wiring boards of a glass epoxy or polyimide resin, inorganic wiring board of alumina, aluminum nitride or glass, and semiconductor substrate of silicone or gallium arsenic, while the board employed may not be limited to any specific one. The isolated conductor circuit pattern 11 formed on the wiring circuit board 12 is to function as a terminal part connected to an IC chip, for example, and is provided in a plurality of rows, and the electrically conducting layer 13 is to be formed so as to be in contact with a plurality of isolated conductor circuit patterns 11.

This electrically conducting layer 13 forms an electrically conductive layer having an electric conductivity, and is formed with a material which can be peeled off by means of heat, a solvent or an alkali. As the material for the electrically conducting layer 13 here, one which consists of, for example, a heat peeling type resin, solvent peeling type resin or an alkali peeling type resin, and an electrically conductive substance added thereto. While it is preferable to add to the electrically conducting layer 13 an electrically conductive filler as the conductive substance, this should not be limited specifically. In order to secure the electric conductivity of the electrically conducting layer 13, a powder of such metal as copper, silver or the like should preferably be added. An addition of carbon powder is also optimum in reducing costs for the material of the electrically conducting layer 13.

While the process for forming the electrically conducting layer 13 shall not be specifically limited, it is preferable to utilize a screen printing or the like process in an event where the material for forming the electrically conducting layer 13 is in, for example, a state of paste, but is optimum to form the layer by means of a thermocompression bonding or the like process when the material is one of filmy moldings. So long as the material of the electrically conducting layer 13 is not photosensitive, the electrically conducting layer 13 should be formed, as shown in FIGS. 1(a) and 2(a), so as to be in contact with the isolated conductor circuit pattern 11 at least at a deposit coat forming position 14 at which a deposit coat is to be formed and disposed below this deposit-coat forming position. When, on the other hand, the material for the electrically conducting layer 13 is photosensitive, the electrically conducting layer 13 may be formed all over the wiring circuit board 12 as shown in FIG. 3(a). Since the electrically conducting layer 13 acts as a power supply layer in electroplating later performed, the layer 13 should preferably be formed over to end edges of the wiring circuit board 12 as far as possible, for promotion of the power supply during the plating.

Next, a protect layer 15 is formed to be superposed on the electrically conducting layer 13 on portions other than the deposit-coat forming position 14. While the protect layer 15 employed here shall not be limited to any specific material, any one of materials available in the market may properly be selected in accordance with properties of electroplating solution employed. In forming the protect layer 15 and so long as the material for the layer 15 is in the paste state and is not photosensitive, the formation at portions other than the deposit-coat forming position 14 and as superposed on the electrically conducting layer 13 is made possible by means of the screen-printing or the like process (see FIG. 1(b)). When the protect layer 15 is of a photosensitive material, the protect layer 15 is formed at portions including the position 14 of forming the deposit coat 17 and as superposed on the electrically conducting layer 13 (FIGS. 2(b) and 3(b)), and thereafter the protect layer 15 at the deposit-coat forming position 14 (including the electrically conducting layer 13 when this layer 13 is also photosensitive) is removed as in FIGS. 2(c) and 3(c) under predetermined conditions through an exposure and development.

Next, the electroplating is performed with the electrically conducting layer 13 used as a power supply layer, and a metal 16 is caused to be deposited as in FIGS. 1(d), 2(d) and 3(d) on the isolated conductor circuit pattern 11 at portions where the protect layer 15 is not formed. This deposit metal 16 may properly be selected from Au, Sn and the like in accordance with connection specification.

Then, the electrically conducting layer 13 and protect layer 15 left on the wiring circuit board 12 are peeled off under the predetermined conditions (by means of heat, solvent or alkali), and the desired deposit coat 17 is formed by the deposit metal 16 thus exposed as in FIGS. 1(d), 2(e) and 3(e). In an event when the electrically conducting layer 13 is peeled off, the deposit coat 17 may happen to be oxidized depending on existing conditions, and it is desirable that a reduction or the like treatment is properly performed with such neutral solvent as dimethylamine volan solution or the like, after the peeling.

Figure 2:
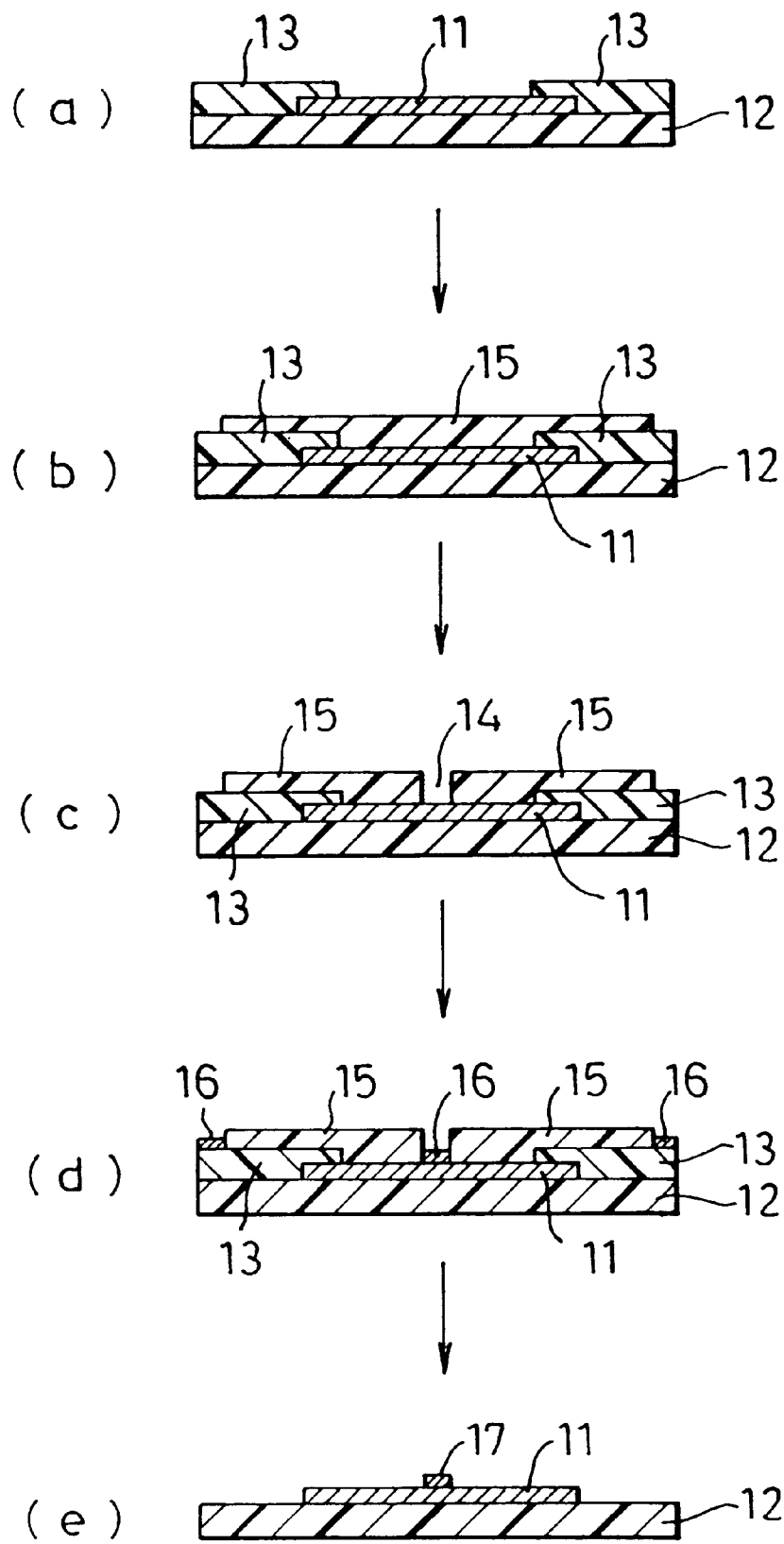
FIGS. 2(a) to 2(e) show in sectioned views respective steps in another embodiment of the present invention.
Figure 3:
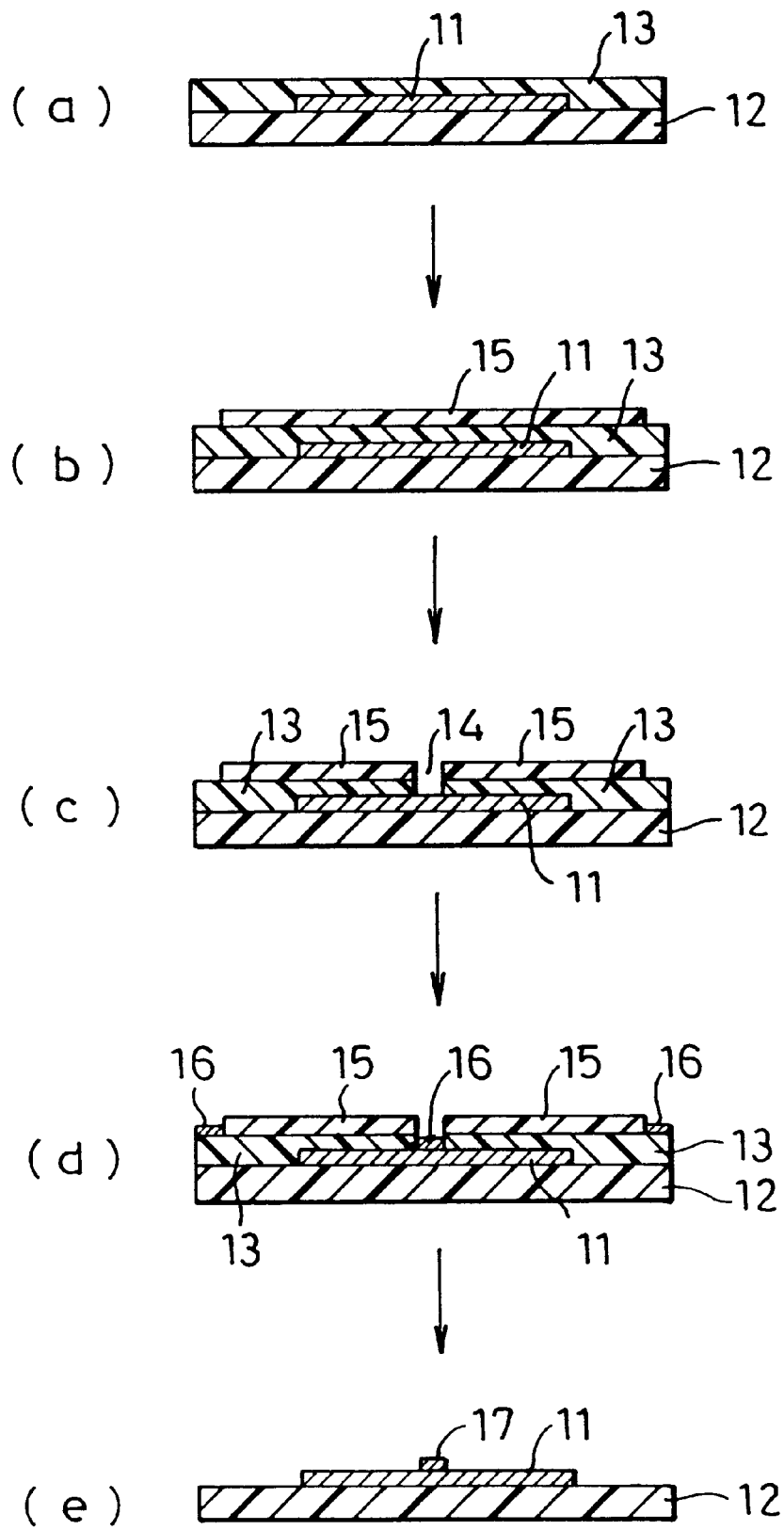
FIGS. 3(a) to 3(e) are sectioned views for explaining respective steps in another embodiment of the present invention.

The process of plating on the isolated conductor circuit according to the present invention as shown in FIGS. 1 to 3 shall be further described in detail with reference to certain experiments.

EXPERIMENT 1:

A ceramic wiring circuit board 12 having the isolated conductor circuit pattern 11 formed with nickel-coated copper was prepared, and a sample was prepared in accordance with the steps of FIG. 1. First, an electrically conductive paste was prepared by dispersing silver particles in a heat-peeling type resin and kneading them, and the electrically conducting layer 13 was formed on the above wiring circuit board 12 with this paste by means of the screen printing process (at other portions than the deposit-coat forming position 14 and to contact the isolated conductor circuit pattern 11). Then, an alkali-peeling type plating resist available in the market (non-photosensitive) in the state of paste was printed by means of the screen printing process at portions other than the deposit-coat forming position 14 and to be superposed on the electrically conducting layer 13, the printed resist was dried and the protect layer 15 was formed.

An electroplating of tin was performed to a thickness of 10 $\mu$m with the electrically conducting layer 13 utilized as a power supply layer, and metallic tin was deposited at the portions not coated by the protect layer 15. Then, using an aqueous solution of sodium hydroxide, the protect layer 15 left on the wiring circuit board 12 was first removed, and thereafter the remaining electrically conducting layer 13 was peeled off through the heat treatment performed at 180° C. for 10 minutes. During the above heat treatment, the deposit coat metal of tin was oxidized to some extent, and the reduction treatment was performed with the aqueous solution of dimethylamine volan (pH 7), whereby the formation of the deposit coat 17 of tin was completed.

Since in this Experiment no etching treatment with any acid and the like was performed, it was possible to obtain the desired deposit coat 17 without damaging to the isolated conductor circuit pattern 11.

EXPERIMENT 2:

Except for the use of copper particles as dispersed and kneaded with the resin as the material for the electrically conducting layer 13, the same steps as in Experiment 1 were performed to form the deposit coat 17. As a result, it was possible to obtain the desired deposit coat 17 similarly to Experiment 1, without damaging the isolated conductor circuit pattern 11.

EXPERIMENT 3:

A ceramic wiring circuit board 12 was prepared with the isolated conductor circuit pattern 11 formed with nickel-coated copper, and a sample was arranged in accordance with the steps of FIG. 2. First, the electrically conductive paste of the heat-peeling type resin was prepared with carbon particles dispersed and kneaded, and the electrically conducting layer 13 was formed on the wiring circuit board 12 by means of the screen printing process (at portions other than the deposit-coat forming position 14 and in contact with the isolated conductor circuit pattern 11). Next, an alkali-peeling type, photosensitive paste of plating resist available in the market was printed by means of the screen printing process at the portion including the deposit-coat forming position 14 and to be superposed on the electrically conducting layer 13, the printed resist was dried and the protect layer 15 was formed.

Then, through the exposure and development of the protect layer, blind bore holes of 50 $\mu m\phi$ were made at the deposit-coat forming position 14, and the metal tin was deposited inside the blind bore holes through an electroplating of tin to the thickness of 10 $\mu m$ performed with the electrically conducting layer 13 utilized as the power supply layer. Then the protect layer 15 left on the wiring circuit board 12 was first removed by using the aqueous solution of sodium hydroxide, and thereafter the remaining electrically conducting layer 13 was peeled off through the heat treatment made at 180° C. for 10 minutes. Since the surface of tin forming the deposit coat was slightly oxidized during the above heat treatment, the reduction treatment was performed with the aqueous solution of dimethylamine volan (pH 7), and the formation of the deposit coat 17 of tin was completed. Without employment of the etching treatment by means of any acid in the present Experiment, too, the desired deposit coat 17 could be obtained without damaging the isolated conductor circuit pattern 11.

EXPERIMENT 4:

A printed wiring circuit board 12 having the isolated conductor circuit pattern 11 formed with nickel-coated copper was prepared, and a sample was arranged in accordance with the steps of FIG. 3. The electrically conductive paste was first prepared by dispersing carbon particles in a resin having the photosensitivity and alkali-peeling type, and kneading them, and the electrically conducting layer 13 was formed all over the wiring circuit board 12 by means of the screen printing process. Next, the alkali peeling type, photosensitive plating resist available in the market was printed all over the wiring circuit board 12 except end parts of the board by means of the screen printing process, and the protect layer 15 was formed.

Next, by subjecting the protect layer 15 and electrically conducting layer 13 simultaneously to the exposure and development, blind bore holes of 50 $\mu m\phi$ were formed at the position 14 for forming the deposit coat. Then the electroplating of tin was performed to the thickness of 10 $\mu m$ with the electrically conducting layer 13 utilized as the power supply layer, and the metal tin was deposited within the blind bore holes. Then the protect layer 15 and electrically conducting layer 13 left on the wiring circuit board 12 were simultaneously peeled off by means of the aqueous solution of sodium hydroxide, and the formation of the deposit coat 17 of tin was completed. Without employing the etching treatment with any acid in the present experiment, too, the desired deposit coat 17 could be obtained without damaging the isolated conductor circuit pattern 11. As the alkali-peeling type, photosensitive electrically conducting layer 13 was employed in the present experiment, the peeling step could be shortened as compared with Experiment 1.

EXPERIMENT 5:

A ceramic wiring circuit board 12 having the isolated conductor circuit pattern 11 formed with nickel-coated copper was prepared, and a sample was arranged in accordance with the steps of FIG. 3. An electrically conductive paste was first prepared by dispersing copper particles in a photosensitive, solvent-peeling type resin and kneading them, and the electrically conducting layer 13 was formed all over the wiring circuit board 12 by means of the screen printing process. Then the solvent-peeling type, photosensitive plating resist in the state of paste and available in the market was printed by the screen printing process all over the wiring circuit board 12 except both end portions, to have the protect layer 15 formed.

Next, by subjecting the protect layer 15 and electrically conducting layer 13 simultaneously to the exposure and development, the blind bore holes of 50 $\mu m\phi$ were formed at the position for forming the deposit coat. Then an electroplating of gold was performed to a thickness of 10 $\mu m$ with the electrically conducting layer 13 utilized for the power supply, and gold was deposited within the blind bore holes. Then the protect layer 15 and the electrically conducting layer 13 left on the wiring circuit board 12 were simultaneously peeled off with MEK employed, and the formation of gold deposit coat was completed. In the absence of the etching treatment by means of any acid also in the present experiment, the desired deposit coat could be obtained without damaging the isolated conductor circuit pattern 11. By the employment of the solvent-peeling type, photosensitive electrically conducting layer 13 in the present experiment, the peeling step could be shortened in comparison with the step in Experiment 1.

In performing the electroplating as has been described, the plating thickness is required to be excellent in the uniformity and, according to another feature of the present invention, there is provided an arrangement for improving the uniformity in the thickness of the deposit coat.

Figure 4:
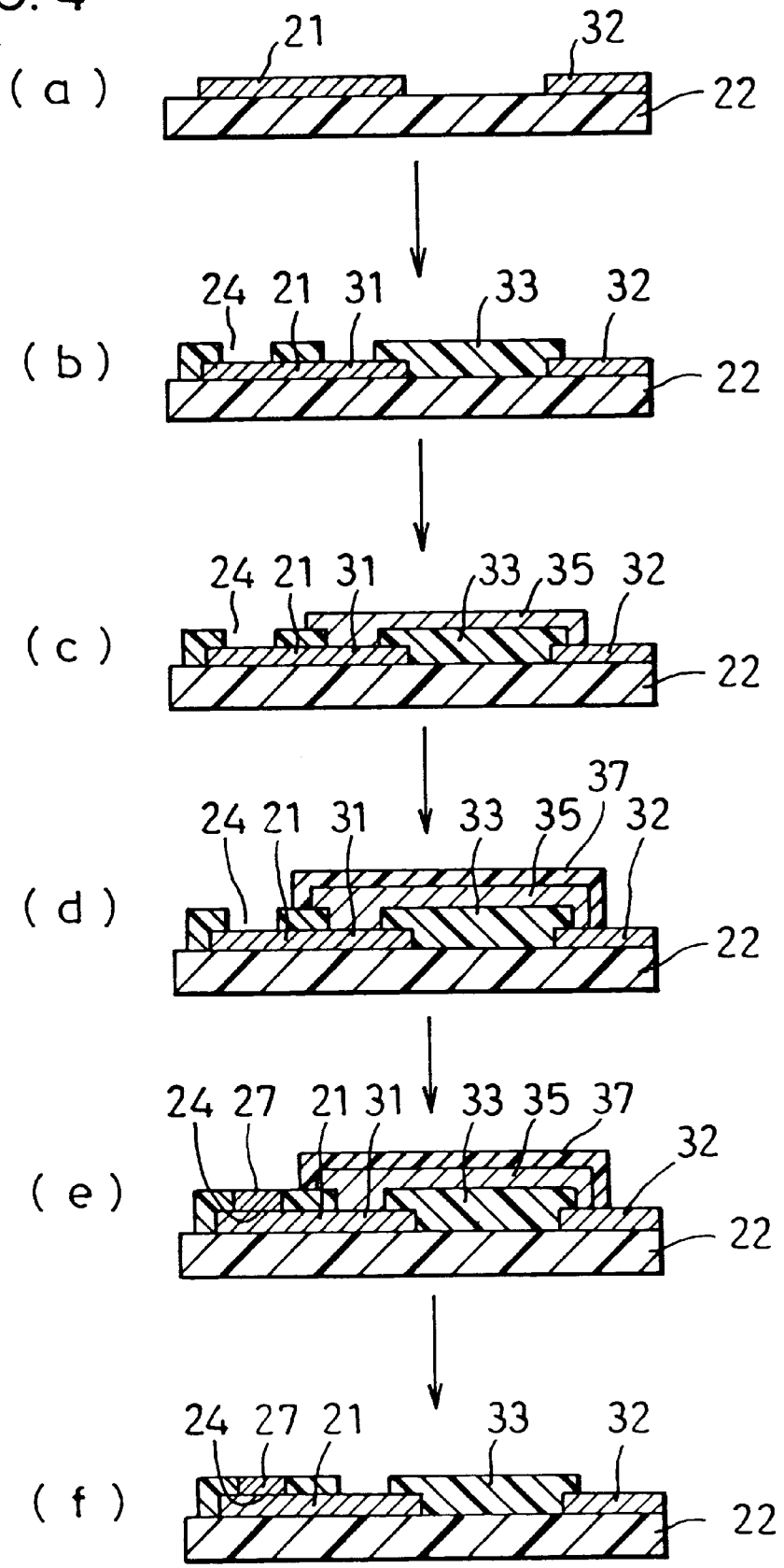
FIGS. 4(a) to 4(f) are sectioned views for explaining respective steps in still another embodiment of the present invention.
Figure 5:
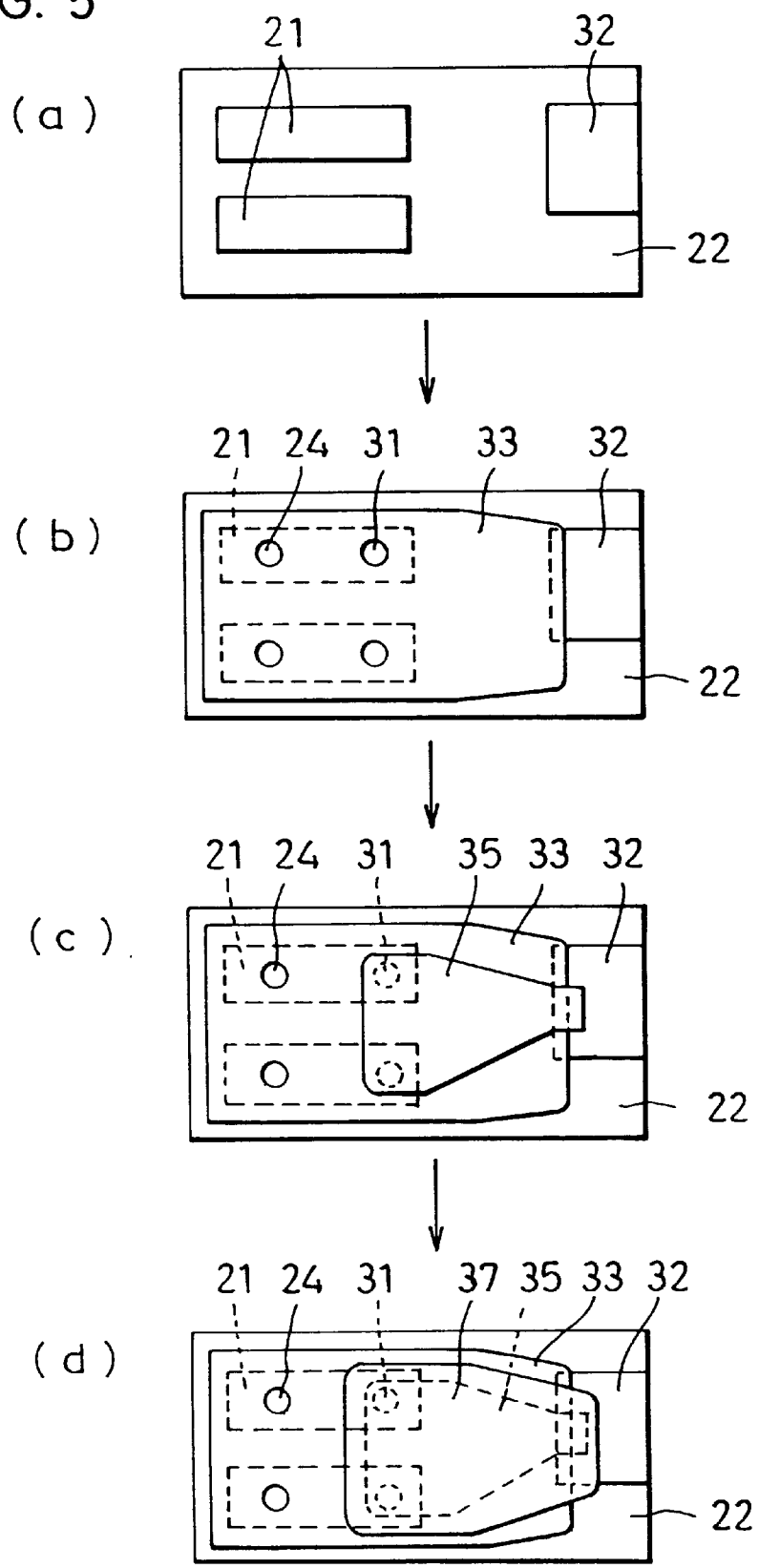
FIGS. 5(a) to 5(d) show in plan views for explaining the steps in the embodiment of FIG. 4.

Referring to FIGS. 4 and 5, the arrangement for unifying the deposit coat as in the above is shown, in which such wiring circuit board 22 as shown in FIGS. 4(a) and 5(b) and provided on top surface with isolated conductor circuit pattern 21 and with a power supply terminal 32 formed as separated from the pattern 21. The power supply terminal 32 is part to be used as a terminal for connection with a power source for the power supply at a later described step of electroplating, and should preferably be formed for ready connection to the power source by disposing the terminal 32 to an extreme end edge part as much as possible.

For the material of the wiring circuit board 22, such plastic board as a board to which glass cloth is adhered with an epoxy resin or of polyimide or the like films, such inorganic board as alumina, aluminum nitride or glass and semiconductor board of silicone, gallium arsenic or the like may be employable, but needs not be specifically limited. For the material forming the isolated conductor circuit pattern 21 or the power supply terminal 32, such metal as copper, nickel or the like may be used in general.

Next, as shown in FIGS. 4(b) and 5(b), a first electrically insulating protect layer 33 is formed on the wiring circuit board 22, so as to coat the whole surface of the isolated conductor circuit pattern 21, except portions 24 for forming the deposit coat and portions 31 for connection to the power source, and to expand from the coated surface of the circuit pattern 21 to the power supply terminal 32.

For the material for forming the first protect layer 33, while not specifically limited, any one of dry films, resin pastes and the like generally available in the market may be employed so long as they are electrically insulating and do not hinder the later performed electroplating. Generally, in the case of the dry film, the film is thermocompression-bonded and hardened at predetermined portions as exposed to light, then other portions not exposed to light are removed, and the first protect layer 33 is formed, whereas, in the case of the resin paste, the paste is applied onto the board by means of the screen printing process or the like, and is hardened to form the first protect layer 33.

In an event where the portions 24 for forming the deposit coat on the isolated conductor circuit pattern 21 are very fine in size, it is preferable to select a photosensitive material for forming the first protect layer 33, so as to be able to form the fine portions 24 for forming the deposit coats by means of a photographic printing.

Next, as shown in FIGS. 4(c) and 5(c), an electrically conducting layer 35 is formed on the surface of the first protect layer 33 and of the power supply terminal 32, so as to coat the portions 31 of the circuit pattern 21 for its connection to the power source and as to conduct between the power source connecting portions 31 and the power supply terminal 32, while exposing the deposit-coat forming portions 24. It is important that the electrically conducting layer 35 will not be formed on portions of the wiring circuit board 22 on the exposed insulating layer of the wiring circuit board 22.

Further, the electrically conducting layer 35 may be formed to cover the entire surface of the power supply terminal 32 or to cover only part of the terminal. Since the through the screen printing process and thereafter hardened, a forming process in which a photosensitive, electrically conducting film formed by a mixture of the resin which forms the hardened substance made peelable by heat, solvent or alkali with the electrically conductive filler is thermocompression-bonded, predetermined portions of the bonded film are exposed to light to harden the portions, and other portions not exposed to light are then removed, and the like processes. An employment of the process in which the electrically conducting paste is applied and thereafter hardened is preferable in view of its excellence in the productivity.

When the resin contained in the electrically conductive paste is a phenolic resin that forms the hardened substance peelable with alkali, it is possible to prevent such problem as a deterioration in the handling properties from occurring when heated, and the hardened substance can be readily made peelable by immersing it in an alkaline solution of caustic soda or the like of a relatively low concentration, without requiring any chlorine solvent which is a hazardous material, and is preferable.

In an event when the electrically conductive paste prepared by mixing a phenolic resin that forms the hardened substance made peelable by alkali with the electrically conducting filler, it is preferable to form the electrically conducting layer 35 by heating the applied paste at 50° C. to 150° C. to have it hardened. In the case when the heating temperature is higher than 150° C., the hardening advances excessively, and the peeling off with an alkali solution at the subsequent peeling step of the electrically conducting layer 35 becomes difficult. When the heating temperature is lower than 50° C., on the other hand, there arises no problem in the peeling ability but the hardening may become insufficient in some occasion, and there arises a possibility that the required electric conductivity cannot be secured upon the electroplating.

For the electrically conducting filler, while not specifically limited, the use of powder of such metal as copper, silver or the like renders the electric conductivity of the electrically conducting layer 35 to be easily secured and is thus preferable. The use of carbon powder as the electrically conducting filler is preferable in reducing costs for the materials of the electrically conducting layer 35.

Further, as the electrically conducting layer 35 is formed on the surfaces of the first protect layer 33 and power supply The second protect layer 37 is formed with a material that does not hinder the subsequent electroplating and peelable with heat, solvent or alkali. For the material of this second protect layer 37, it is possible to employ, for example, any one alone of the resin that forms the hardened substance peelable with heat, resin that forms the hardened substance peelable with the solvent, and resin that forms the hardened substance peelable with alkali, or a mixture of such insulating filler as glass powder with any of these resins.

For the process of forming this second protect layer 37, further, there may be enumerated such ones as a process in which an electrically insulating paste in liquid type of the resin alone that forms the hardened substance peelable with heat, solvent or alkali or a mixture of such resin with the insulating filler is applied by means of the screen printing process or the like and is then hardened to form the layer 37; a process in which a photosensitive, electrically insulating film of the resin that forms the hardened substance peelable with heat, solvent or alkali is compression-bonded, predetermined portions of the bonded film are exposed to light to have them hardened, and other portions not exposed to light are removed, so as to form the layer 37. The use of the process in which the electrically insulating paste is applied and then hardened is preferable in view of its excellence in the productivity.

Further, when the resin contained in the electrically insulating paste is the phenolic resin that forms the hardened substance peelable with alkali, the hardened substance of the resin can be easily peeled off by immersing it in an alkaline solution of caustic soda at a relatively low concentration, without using any heat or hazardous chlorine solvent, and this resin is preferable. When this electrically insulating paste containing the phenolic resin which forms the hardened substance peelable with alkali, it is preferable to harden the paste by heating it at 50° C. to 150° C. after the application. When the heating temperature is higher than 150° C., the hardening advances excessively, so that the peeling of the second protect layer 37 with the alkaline solution at the later step of peeling the layer off will be difficult. When the heating temperature is lower than 50° C., it does not matter for the peeling ability but the hardening may become insufficient, and there may happen that the characteristics as the protect layer upon performing the electroplating cannot be shown.

Next, an electric power is supplied to the power supply terminal 32 in the state where the entire board is immersed in an electroplating bath (not shown), and the deposit coats 27 are formed at the portions 24 for forming the deposit coat, as shown in FIGS. 4(e) and 5(d).

At this time, as the whole surface of the electrically conducting layer 35 at the portions formed on the first protect layer 33 and on the power source connecting portions 31 are coated by the second protect layer 37, the plated metal is prevented from being deposited on other unnecessary portions than the deposit-coat forming portions 24, and the deposit coat 27 excellent in the uniformity of thickness is formed at the forming portions 24. When the second protect layer 37 is not formed on the electrically conducting layer 35 or when the second protect layer 37 is defective in the coating, a deposit coat is also formed on the surface of the electrically conducting layer 35 exposed upon the electroplating, a desired current density cannot be obtained at some part on the deposit-coat forming portions 24, and a fluctuation in the thickness of the deposit coat 27 formed on the portions 24 becomes remarkable.

Then, the second protect layer 37 and electrically conducting layer 35 are peeled off, whereby the isolated conductor circuit pattern 21 as shown in FIGS. 4(f) and 6(b) or the isolated conductor circuit pattern 21 hardly damaged at the insulating part and having the deposit coats 27 formed to be excellent in the thickness uniformity can be obtained.

Figure 7:
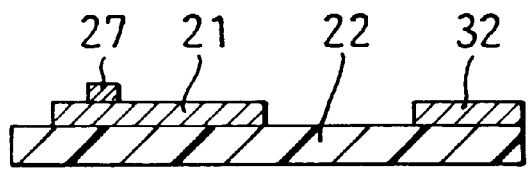
FIG. 7 is a sectioned view for explaining part of steps in another embodiment of the present invention.
Figure 8:
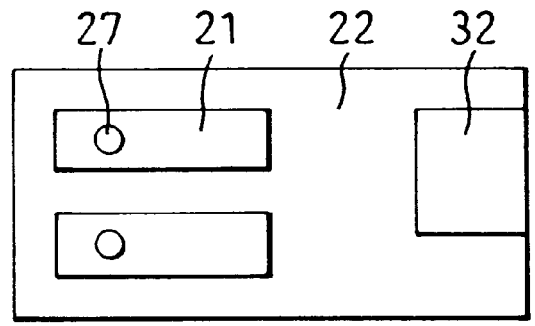
FIG. 8 is a plan view for explaining part of the steps in the embodiment of FIG. 7.

In the event when the second protect layer 37 and electrically conducting layer 35 are peeled off but the first protect layer 33 is left, the first protect layer 33 can be utilized as a permanent resist of soldering resist or the like. When the permanent resist is not required, it will be possible to select a material which can be peeled off with any of the heat, solvent and alkali as the material for forming the first protect layer 33, and to peel off also the first protect layer 33 together with the second protect layer 37 and electrically conductive layer 35. This state in which the first protect layer 33 is peeled off is shown in FIGS. 7 and 8.

Figure 9:
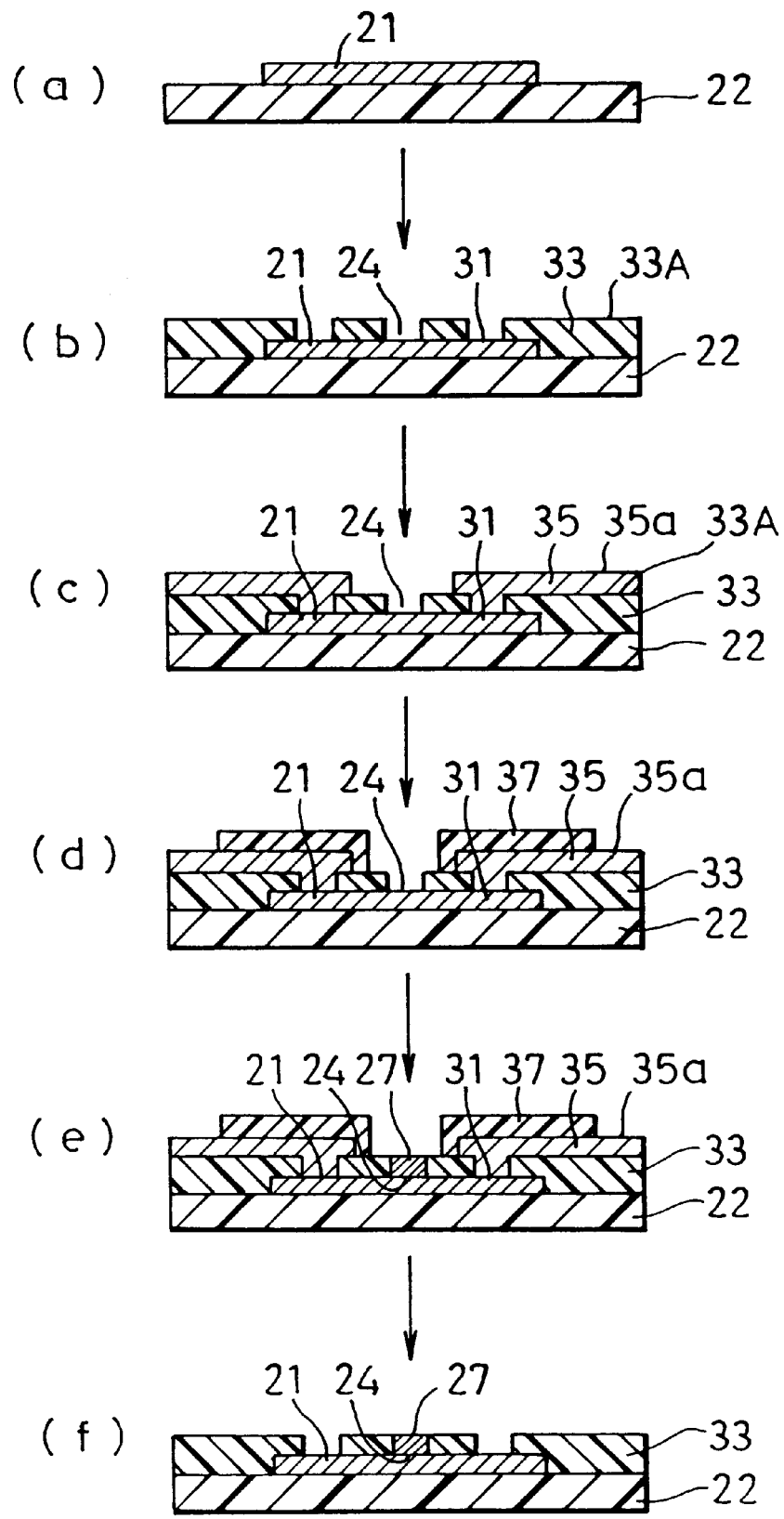
FIGS. 9(a) to 9(f) are sectioned views for explaining steps in another embodiment of the present invention.
Figure 10:
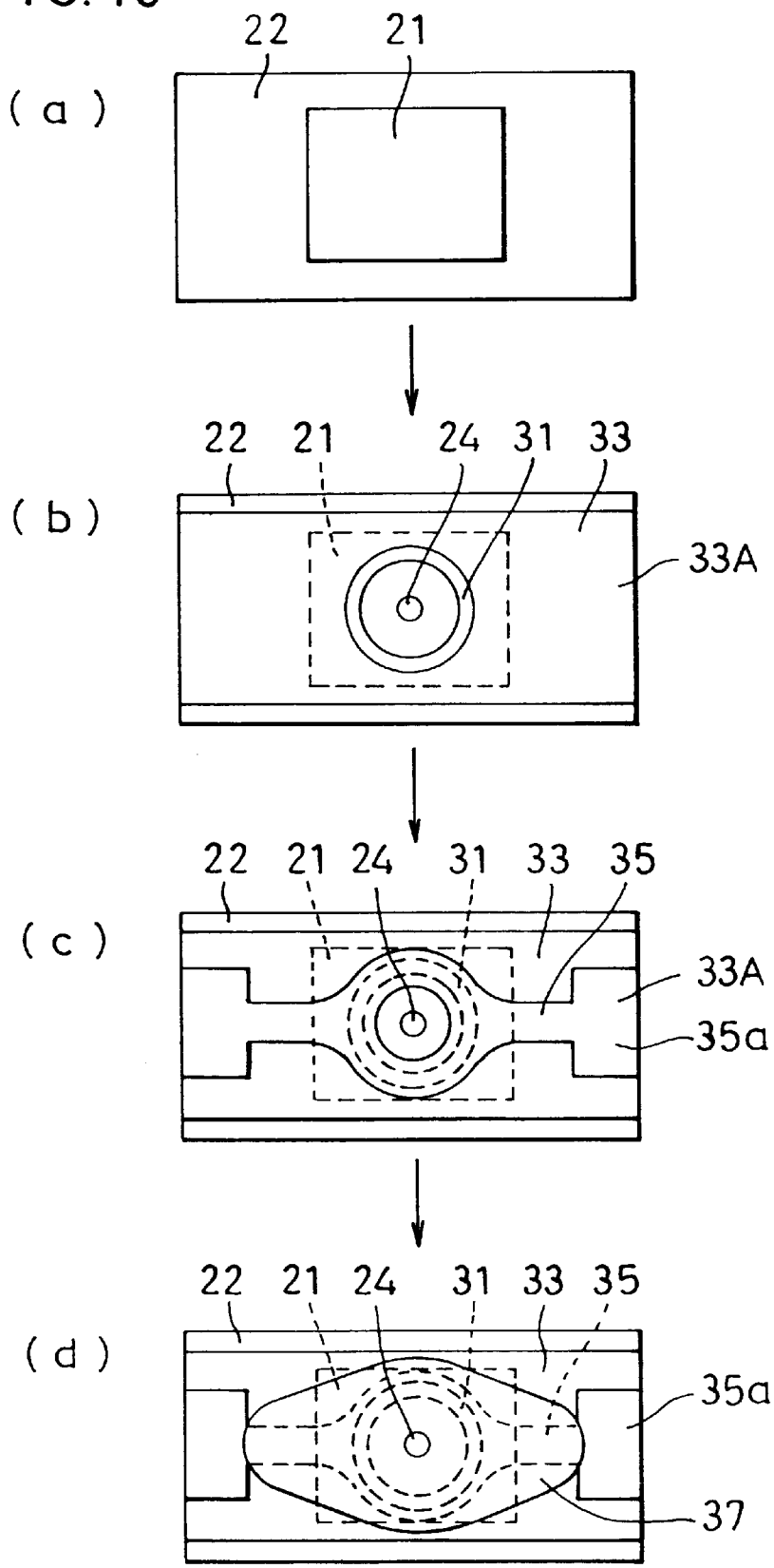
FIGS. 10(a) to 10(d) show in plan views the steps of the embodiment of FIG. 9.

According to another embodiment attempting the uniformity of the deposit coat in the present invention, there is provided a process in which a wiring circuit board 22 provided on the surface only with the isolated conductor circuit pattern 21 at the initial stage as shown in FIGS. 9 and 10, in contrast to the foregoing embodiment of FIGS. 4 to 8. For a substrate used as the material for the wiring circuit board 22, or a material for forming the isolated conductor circuit pattern 21, there may be enumerated the same one as that in the plating process for the isolated conductor circuit of the foregoing embodiment of FIGS. 4 to 8.

Next, as shown in FIGS. 9(b) and 10(b), the first protect layer 33 electrically insulative is formed on the wiring circuit board 22, so as to coat the whole surface of the isolated conductor circuit pattern 21 except the deposit-coat forming portions 24 and power source connecting portions 31, and to expand from the part of the surface of the coated isolated conductor circuit pattern 21 to the position 33A where a power supply terminal is to be formed and separated from the isolated conductor circuit pattern 21.

The material for forming this first protect layer 33 or the process for forming the same may be the same as the plating process for the isolated conductor circuit in the embodiment of FIGS. 4 to 8. The position 33A at which the power supply terminal is to be formed is the position where the electrically conducting layer is formed at a subsequent step to be a power supply terminal part of the electrically conducting layer, and, as the power supply terminal part is used as a terminal for supplying the power as connected to the power source at the subsequent electroplating step, its provision at the end edge portions of the wiring circuit board 22 as far as possible renders the connection to the power source to be easier and is preferable.

Next, as shown in FIGS. 9(c) and 10(c), the electrically conducting layer 35 consisting of the material electrically conducting and peelable with any of heat, solvent and alkali is formed on the surface of the first protect layer 33, so as to coat the position 33A where the power source connecting portion 31 and power supply terminal are to be formed and to conduct between the power source connecting portion 31 and the position 33A for forming the power supply terminal while exposing the deposit coat forming portion 24, and the electrically conducting layer 35 having the power supply terminal 35a is formed.

Materials for forming this electrically conducting layer 35 and the process for forming the same may also be the same as those in the plating process for the isolated conductor circuit in the foregoing embodiment of FIGS. 4 to 8.

Since the electrically conducting layer 35 is used as the power supplying layer at the subsequent electroplating step, it is preferable that, in order to render the thickness of the deposit coat as deposited to be uniform, the layer 35 is formed so that the power source connecting portion 31 and the power supply terminal portion 35a are conducted through as much wider course as possible, for easier power supply and uniform distribution of current density within the surface of the wiring circuit board 22.

Because the electrically conducting layer 35 is formed on the surface of the first protect layer 33, the layer 35 is made hard to directly contact the insulating portions of the wiring circuit board 22 where any conductor circuit or the like is not formed, so that the insulating portions are less damaged to be contaminated due to the presence of the electrically conducting filler or the like for forming the electrically conducting layer 35.

Next, as shown in FIGS. 9(d) and 10(d), the second protect layer 37 consisting of the material electrically insulating and peelable with heat, solvent or alkali is formed to coat the whole surface of the electrically conducting layer 35 except the power supply terminal portion 35a in the surface of the first protect layer 33. The materials for forming this second protect layer 37 and its forming process may also be the same as those in the plating process for the isolated conductor circuit in FIGS. 4 to 8.

Figure 11:
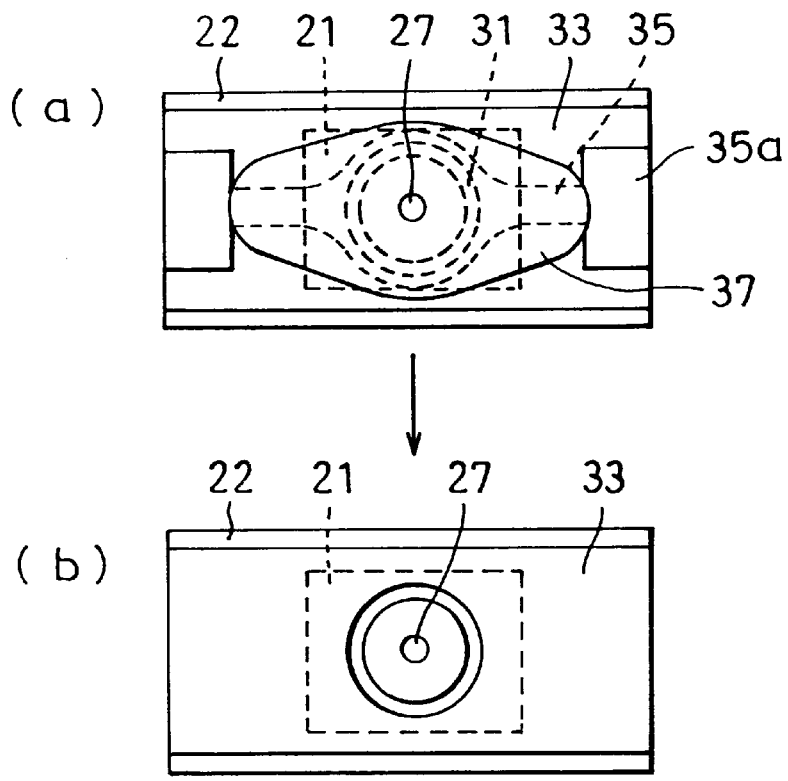
FIGS. 11(a) and 11(b) are plan views for explaining further steps in the embodiment of FIG. 9.

Next, in a state of being immersed in the electroplating solution (not shown), a power is supplied to the power supply terminal portion 35a of the electrically conducting layer 35, and the deposit coat 27 is formed at the deposit-coat forming portion 24 of the isolated conductor circuit pattern 21, as shown in FIGS. 9(e) and 11(a).

Since at this time the whole surface of the conducting layer 35 except the power supply terminal portion 35a is coated by the second protect layer 37, any plated metal deposition on unnecessary portions other than the deposit-coat forming portion 24 can be prevented, and the deposit coat 27 excellent in the thickness uniformity can be formed at the deposit-coat forming portion 24. In an event when the second protect layer 37 is not formed on the surface of the conducting layer 35 or when the second protect layer 37 is defective in its coating, the deposit coat is formed also on the surface of the layer 35 exposed upon the electroplating, there arises a part where the desired current density cannot be obtained on the deposit-coat forming portion 24, and the thickness of the deposit coat 27 formed on the portion 24 is remarkably fluctuated.

Next, the second protect layer 37 and conducting layer 35 are peeled off, whereby such isolated conductor circuit pattern 21 as shown in FIGS. 9(b) and 11(b) or the isolated conductor circuit pattern 31 hard to be damaged at the insulating portion and having the deposit coat 27 excellent in the thickness uniformity can be obtained.

Figure 12:
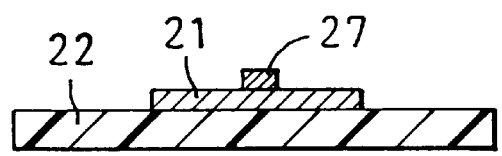
FIG. 12 is a sectioned view for explaining part of steps in still another embodiment of the present invention.
Figure 13:
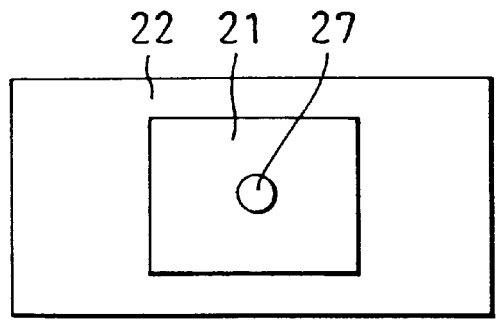
FIG. 13 is a plan view for explaining part of the steps in the embodiment of FIG. 12.

When the second protect layer 37 and conducting layer 35 are peeled off but the first protect layer 33 is kept remain, the first protect layer 33 can be utilized as such permanent resist as a soldering resist. When such permanent resist is not required, on the other hand, a material made peelable with any of heat, solvent and alkali is selected as the one for forming the first protect layer 33, so that the first protect layer 33 can be also peeled off together with the second protect layer 37 and conducting layer 35. This state where the first protect layer 33 is also peeled off is shown in FIGS. 12 and 13.

In the followings, experiments of the plating process for the isolated conductor circuit to which the present invention relates as shown in FIGS. 4 to 13 shall be described in further detail.

EXPERIMENT 6:

First, a ceramic series wiring circuit board 22 having on the surface the isolated conductor circuit pattern 21 in which copper was coated with nickel while nickel was coated by gold and the copper-made power supply terminal 32 formed as separated from the circuit pattern 21 was prepared, and the steps shown in FIG. 4 were sequentially performed. In this case, the power supply terminal was positioned at an end edge portion of the wiring circuit board.

At this time, as shown in FIG. 4(b), the isolated conductor circuit pattern 21 was coated on the whole surface except the deposit-coat forming portions 24 (minimum size 150×150 $\mu$m) and the power source connecting portions 31, and the electrically insulating first protect layer 33 expanding from the surface of the coated circuit pattern 21 to the power supply terminal 32 was formed on the wiring circuit board 22. This first protect layer 33 was formed by providing its pattern by means of the screen printing process with a liquid resin paste for use as the soldering resist (permanent resist) employed, and heat-treating this pattern at 150° C. for 60 minutes.

Next, as shown in FIG. 5(c), the electrically conducting layer 35 consisting of a material peelable with alkali was formed on the first protect layer 33 through a pattern printing by means of the screen printing process with an electrically conducting paste (commodity name "Silver Paste LS-520" manufactured by Kabushiki Kaisha Asahi Kagaku Kenkyusho) containing silver powder as the electrically conducting filler and a phenolic resin that forming the hardened substance peelable with alkali as the resin, and a heat treatment of this pattern at 80° C. for 30 minutes. This electrically conducting layer 35 was formed on the surfaces of the first protect layer 33 and of the power supply terminal 32, so as to coat the power source connecting portion 31 on the isolated conductor circuit pattern 21 and to conduct between the power source connecting portions 31 and the power supply terminal 32, while exposing the deposit-coat forming portions 24.

Then, as shown in FIG. 4(d), the second protect layer 37 consisting of a material peelable with alkali was formed so as to coat the whole surfaces at portions of the conducting layer 35 on the first protect layer 33 and on the power source connecting portions 31, while exposing the deposit-coat forming portions 24.

In forming this second protect layer 37, its pattern was printed by means of the screen printing process with an electrically insulating paste (commodity name "Plating Resist MR300CNo6" manufactured by K.K. Asahi Kagaku Kenkyusho) containing a phenolic resin which forming the hardened substance peelable with alkali and electrically insulating, and this pattern was heat treated at 80° C. for 30 minutes.

Next, an electroplating of tin was performed with respect to the deposit-coat forming portions 24 in the isolated conductor circuit pattern 21 as shown in FIG. 4(e), by immersing the entire board in an electroplating solution of tin and thereafter supplying a power to the terminal 32, and the deposit coats 27 consisting of tin were formed. At this time, the electroplating was performed under conditions suitable for obtaining a thickness of 5 $\mu$m for the deposit coat.

Then the thus obtained board was immersed in caustic soda solution (4%), the second protect layer 37 and conducting layer 35 were peeled off by means of an ultrasonic cleaning system of applying an ultrasonic wave to the board being immersed, and such wiring circuit board 22 as shown in FIG. 4(f) in which the deposit was performed with respect to the isolated conductor circuit pattern 21 was obtained.

EXPERIMENT 7:

First, a ceramic series wiring circuit board 22 having on the surface the isolated conductor circuit pattern 21 including a nickel coating on copper and a further gold coating thereon was prepared, and such steps as shown in FIG. 9 were sequentially performed.

As shown in FIG. 9(b), the first protect layer 33 electrically insulating was formed on the wiring circuit board 22, so as to coat the whole surface of the isolated conductor circuit pattern 21 except the deposit-coat forming portion 24 (minimum size 150×150 μm) and the power source connecting portion 31, and to expand from the coated surface part of the isolated conductor circuit pattern 21 to the position 33A where the power supply terminal is to be formed.

At this time, the position 33A for forming the power supply terminal was separated from the isolated conductor circuit pattern 21 and was positioned at the end edge part of the wiring circuit board 22. Further, the first protect layer 33 was formed by forming its pattern through the screen printing process with the soldering resist (permanent resist) use liquid resin paste employed, and heat-processing this pattern at 150° C. for 60 minutes.

Then, the electrically conducting layer 35 consisting of the material peelable with alkali and having the power supply terminal portion 35a was formed on the first protect layer 33 as shown in FIG. 9(c), employing the same electrically insulating paste and in the same manner as those employed in Experiment 6. This conducting layer 35 was formed on the first protect layer 33, so as to coat the power source connecting portion 31 and the position 33A for forming the power supply terminal, and to conduct between the connecting portion 31 and the terminal forming position 33A, while exposing the deposit-coat forming portion 24.

Next, the second protect layer 37 consisting of the material peelable with alkali was formed with the same electrically insulating paste and in the same manner as in Experiment 6 and as shown in FIG. 9(d), so as to coat the whole surface of the conducting layer 35 except the power supply terminal portion 35a, while exposing the deposit-coat forming portion 24.

Then, after immersing in the same electroplating solution of tin as that employed in Experiment 6, the power was supplied to the power supply terminal portion 35a of the conducting layer 35 to perform the electroplating of tin on the deposit-coat forming portion 24 in the isolated conductor circuit pattern 21 and the deposit coat forming portion 24 of tin was formed. For performing the electroplating at this time, conditions for rendering the thickness of the deposit coat to be 5 μm were set.

Then, the second protect layer 37 and conducting layer 35 were peeled off with the ultrasonic wave cleaning system by applying the ultrasonic wave to the board in the state of immersing the thus obtained board within the caustic soda solution (4%), and such wiring circuit board 22 as shown in FIG. 9(f) in which the plating was performed with respect to the isolated conductor circuit pattern 21 was obtained.

EXPERIMENT 8:

In the same manner as in Experiment 7 except that the heat treatment conditions with respect to the electrically conducting paste for forming the conducting layer 35 were made to be 50° C. for 30 minutes, the wiring circuit board 22 in which the plating was performed with respect to the isolated conductor circuit pattern 21 was obtained.

EXPERIMENT 9:

In the same manner as in Experiment 7 except that the heat treatment conditions with respect to the electrically conducting paste for forming the conducting layer 35 were made to be 150° C. for 30 minutes, the wiring circuit board 22 in which the plating was performed with respect to the isolated conductor circuit pattern 21 was obtained.

EXPERIMENT 10:

In the same manner as in Experiment 7 except that the heat treatment conditions with respect to the electrically conducting paste for forming the conducting layer 35 were made to be 170° C. for 30 minutes, the wiring circuit board 22 in which the plating was performed with respect to the isolated conductor circuit pattern 21 was obtained.

EXPERIMENT 11:

In the same manner as in Experiment 7 except that the minimum size of the deposit-coat forming portion 24 on the isolated conductor circuit pattern 21 was made to be 50×50 μm, a photosensitive dry film (plating-resisting) was used as the material for forming the first protect layer 33, and the formation of the first protect layer 33 was performed in a photographic printing, the wiring circuit board 22 in which the plating was performed with respect to the isolated conductor circuit pattern 21 was obtained.

EXPERIMENT 12:

In the same manner as in Experiment 7 except that the minimum size of the desposit-coat forming portion 24 on the isolated conductor circuit pattern 21 was made to be 50×50 μm, a photosensitive dry film (plating-resisting) forming the substance peelable with alkali was used as the material for forming the first protect layer 33, the first protect layer 33 was formed in the photographic printing, and the first protect layer 33 was peeled off simultaneously with the peeling off of the second protect layer 37 and conductive layer 35, the wiring circuit board 22 in which the plating was performed with respect to the isolated conductor circuit pattern 21 was obtained.

EXPERIMENT 13:

In the same manner as in Experiment 7 except that the second protect layer 37 was formed by using an electrically conducting paste forming the hardened substance peelable with heat as the material for forming the layer 37 (commodity name "Strip Mask #503B-SH" by K.K. Asahi Kagaku Kenkyusho; hardening conditions: 120° C., hardening time 15 minutes; peeling conditions: peeling temperature 180° C., treating time 15 minutes), printing the pattern through the screen printing process, and heat-treating this pattern at 120° C. for 15 minutes; that the electrically conducting layer 35 was formed by employing as its forming material a mixture of the electrically conducting paste peelable as heated with silver powder, printing its pattern through the screen printing process, and heat-treating the pattern at 120° C. for 15 minutes; and that the peeling off of the second protect layer 37 and conducting layer 35 was performed through a heat treatment at 180° C. for 15 minutes; the wiring circuit board 22 in which the plating was performed with respect to the isolated conductor circuit pattern 21 was obtained.

The wiring circuit board 22 obtained through the respective Experiments were evaluated as to the appearance of the isolated conductor circuit pattern 21 and insulating portions and the thickness of the deposit coat. For the appearance of the isolated conductor circuit, whether or not the isolated conductor circuit pattern 21 was damaged by any side-etching was evaluated through visual observation, and a case not damaged was denoted by G.

For the appearance of the insulating portion, the evaluation through the visual observation was made whether or not the insulating portion was damaged to be contaminated by the electrically conducting filler contained in the electrically conducting layer 35 and caused to remain on the surface of the insulating portion where the isolated conductor circuit pattern 21 or the like was not formed on the surface of the wiring circuit board 22, and whether or not the insulating portion was damaged by the conducting layer 35 caused to remain on the insulating portion together with the first protect layer 33 without being peeled off, and the case not damaged was marked as G, while a case partly damaged was marked N.

For the thickness of the deposit coat, the thickness of the deposit coat consisting of tin as formed on the surface of the isolated conductor circuit pattern 21 was measured at 10 positions through observation of section, and their average value, the largest value, the smallest value, and difference value (R) between the largest and smallest values were obtained, of which results were as shown in a following Table.

While it is not always that the foregoing embodiments of FIGS. 4 to 13 are excellent in all properties as compared with the embodiment of FIGS. 1 to 3, it is considered possible in general to improve the properties of the embodiment of FIGS. 1 to 3.

layer 35 or second protect layer 37 at the later step, when the paste is caused to expand towards the deposit coat forming portions 24. Its projecting amount is properly adjusted in accordance with the electric conductivity, formed thickness of the second protect layer, or the distance between the projected part 33a and so on.

For the shape of the projected part 33a, the same is formed in a wavy shape in plan view, between the deposit coat forming portions 24 and the power source connecting portions 31 in the embodiment shown here, but is not required to be specifically limited so long as the same is formed in a shape effective to prevent the deposit-coat forming portions 24 from being filled with the electrically conducting paste or the like. The projected part 33a formed closer to the deposit-coat forming portions 24 can reliably prevent the portions 24 from being filled and is preferable.

For a process for forming the projected part 33a, one in which the projected part 33a is formed at a plurality of steps

TABLE

| Experiment | 6 | 7 | 8 | 9 | 10 | 11 | 12 | 13 |
|---|---|---|---|---|---|---|---|---|
| Electrically Conduct'g Paste | alkali peeling | " | " | " | " | " | " | heat peeling |
| Electrically Insulat'g Paste | alkali peeling | " | " | " | " | " | " | heat peeling |
| Heat'g Conditions for Elec. Cond. Paste | 80° C. 30 m. | 80° C. 30 m. | 50° C. 30 m. | 150° C. 30 m. | 170° C. 30 m. | 80° C. 30 m. | 80° C. 30 m. | 80° C. 30 m. |
| Appear. of Isolt'd Cond. Circuit | G | G | G | G | G | G | G | G |
| Appear. of Insulat'g Portion | G | G | G | G | N | G | G | G |
| Thickness of Deposit Coat (µm) | | | | | | | | |
| Av. | 5.06 | 5.05 | 5.01 | 5.05 | 5.07 | 4.98 | 5.05 | 5.07 |
| Lgst. | 5.12 | 5.11 | 5.10 | 5.12 | 5.13 | 5.02 | 5.15 | 5.13 |
| Smst. | 4.98 | 4.98 | 4.88 | 4.98 | 4.99 | 4.87 | 4.99 | 4.99 |
| R | 0.14 | 0.13 | 0.22 | 0.14 | 0.14 | 0.15 | 0.16 | 0.14 |
| Judg. | G | G | G | G | G | G | G | G |

Further, according to another feature of the present invention, there can be provided a process of plating on the isolated conductor circuit allows for formation of a deposit coat excellent not only in the uniformity of thickness but also in the deposition characteristic by means of the electroplating at desired portions on the isolated conductor circuit formed on the wiring circuit board, without damaging to the isolated conductor circuit formed on the surface of the wiring circuit board or to insulating portions where no isolated conductor circuit is formed any damage.

Figure 14:
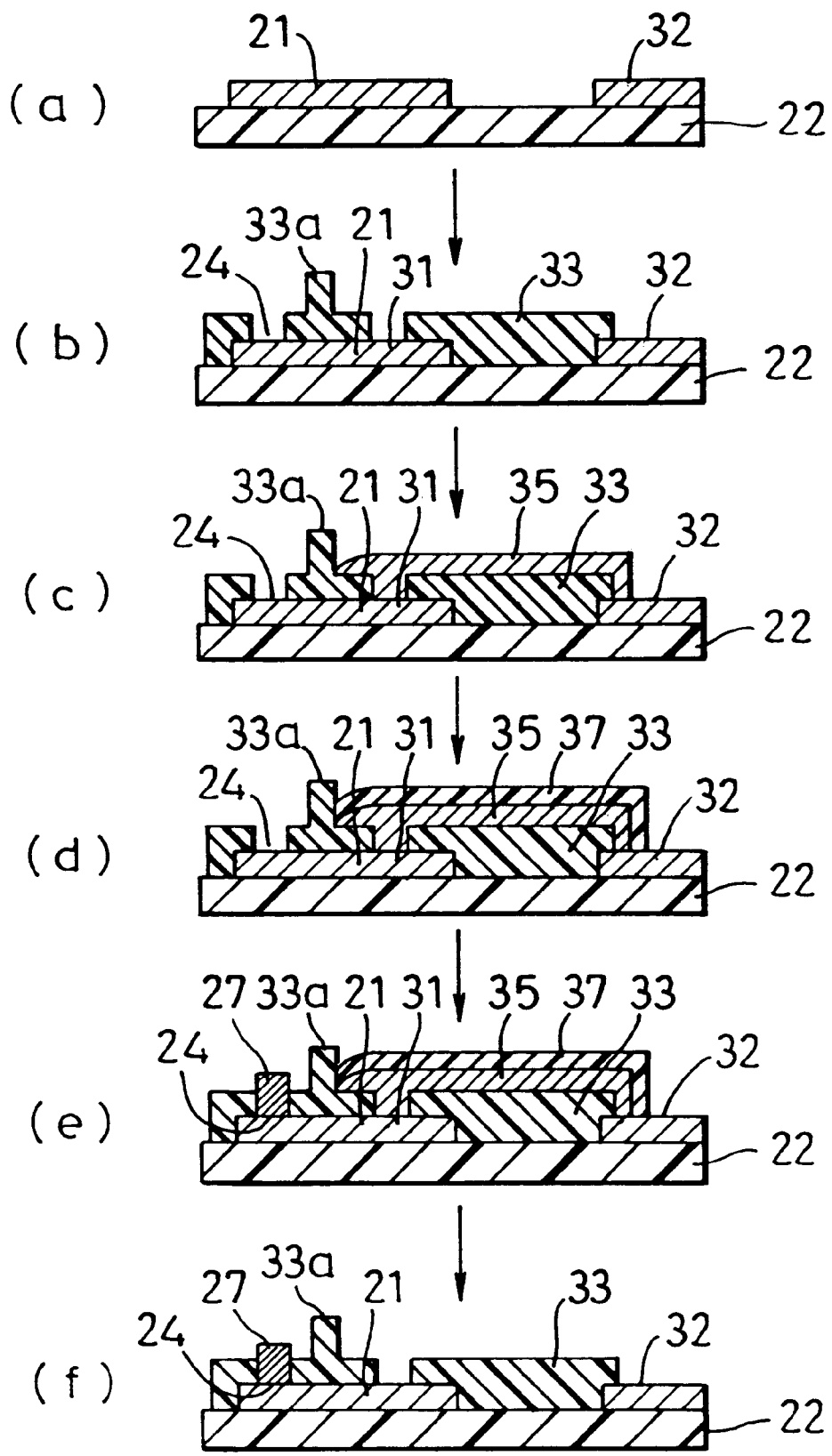
FIGS. 14(a) to 14(f) are sectioned views for explaining steps in still another embodiment of the present invention.
Figure 15:
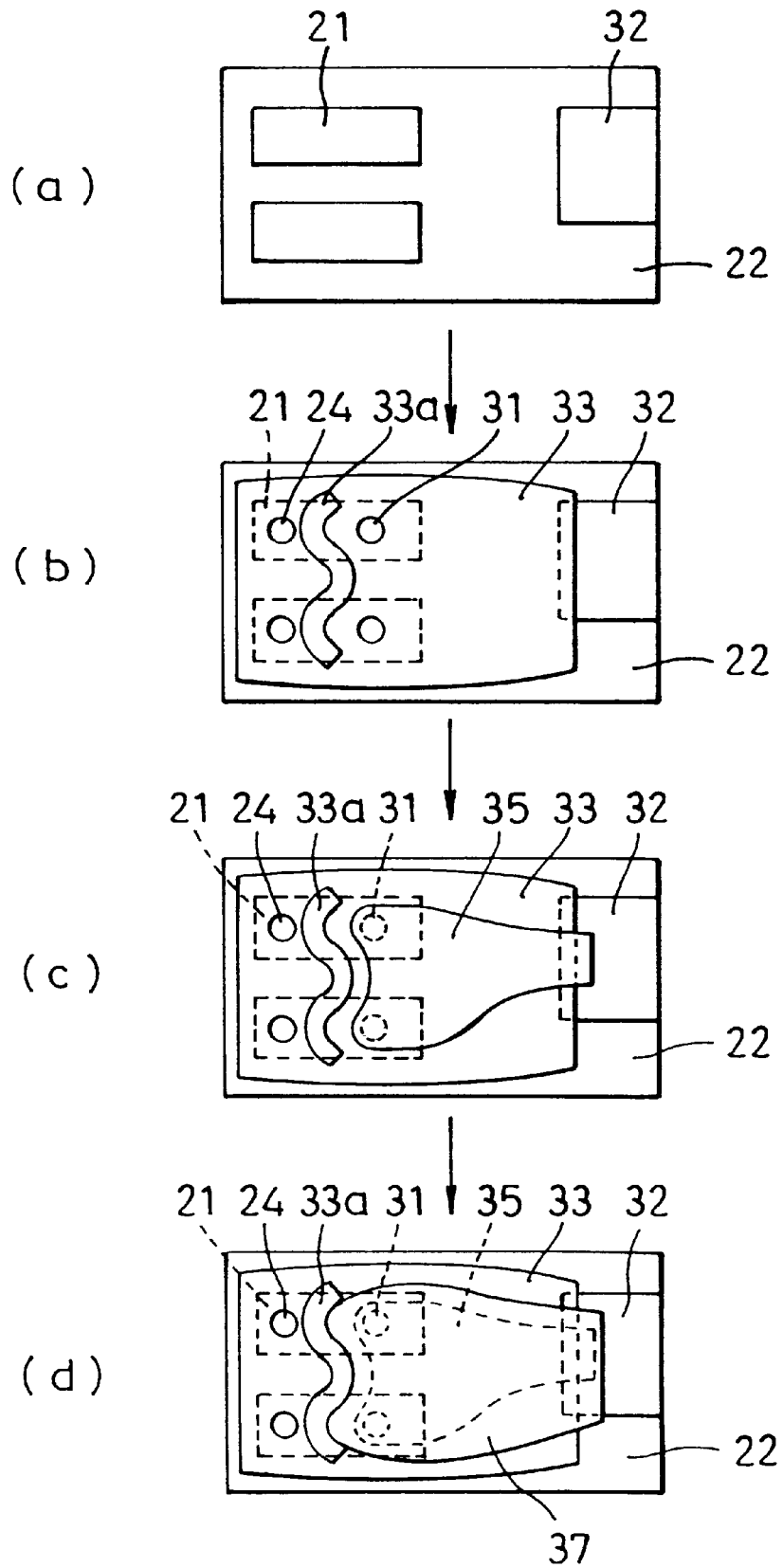
FIGS. 15(a) to 15(d) show in plan views the steps in the embodiment of FIG. 14.

Referring to FIGS. 14 and 15, the arrangement in which the wiring circuit board 22 provided on the surface with the isolated conductor circuit pattern 21 and the power supply terminal 32 formed as separated from the pattern 21 is also employed in the present embodiment, to be substantially the same as the foregoing embodiments.

In the present embodiment, on the other hand, the first protect layer 33 electrically insulating is formed on the wiring circuit board 22 together with a projected part 33a formed between the deposit coat forming portions 24 and the power source connecting portions 31, in contract to the first protect layer 33 formed at the portion where the electrically conducting layer 35 or the second protect layer 37 is to be formed at a subsequent step.

Here, the projected part 33a acts to prevent the deposit coat forming portions 24 from being filled with the electrically conducting paste or the like for forming the conducting such that the first protect layer 33 of the same thickness all over a part where the first protect layer is to be formed, and thereafter a projecting part only of the projected part 33a is formed by supplying again the resin paste or the like, will be general, but it is also possible to form the projected part at one time.

Figure 6:
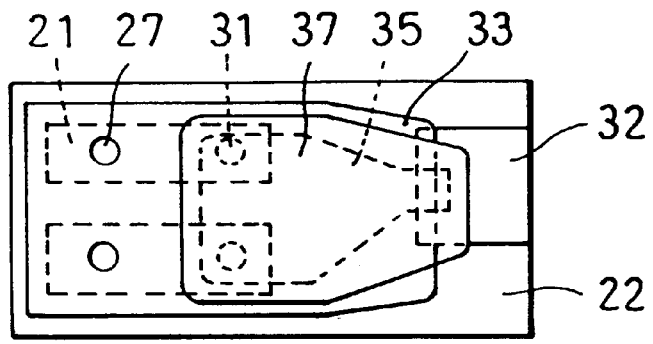
FIGS. 6(a) and 6(b) are plan views for explaining other steps in the embodiment of FIG. 4.
Figure 16:
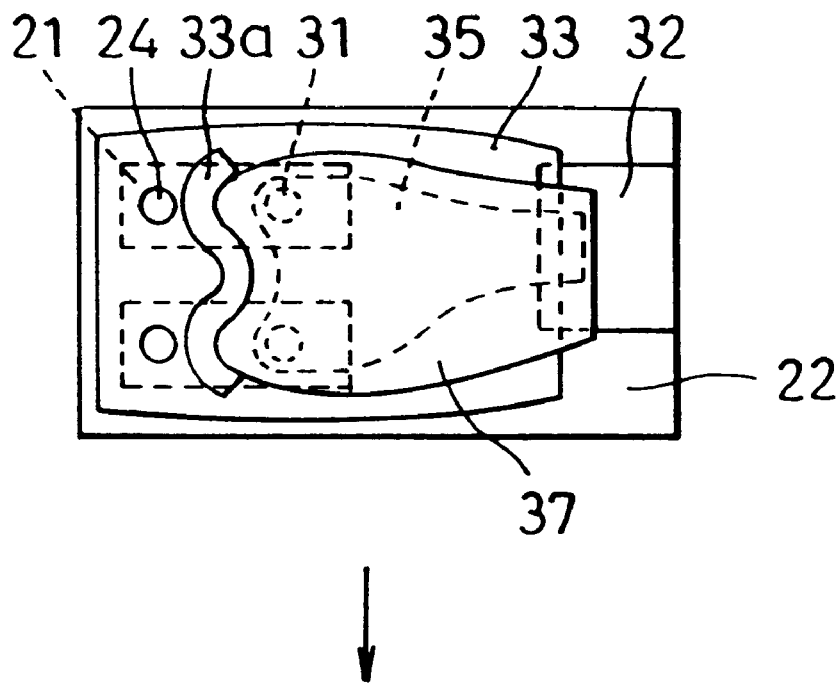
FIGS. 16(a) and 16(b) are plan views for explaining another step in the embodiment of FIG. 14.
Figure 16:
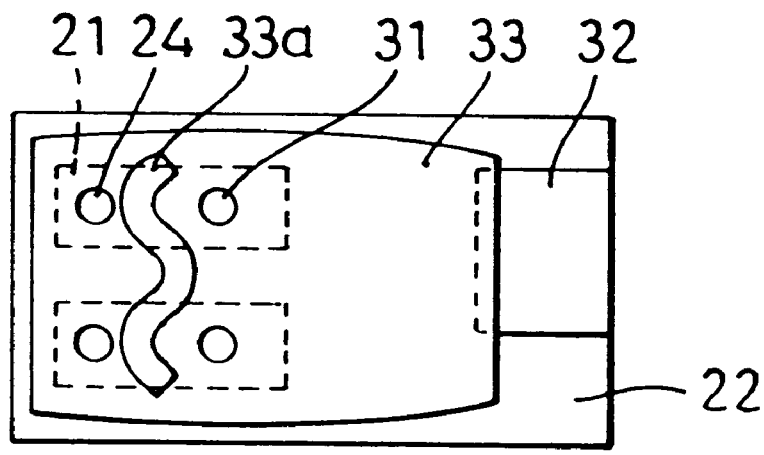

Now, as shown in FIGS. 14 to 16, the deposit coat can be formed substantially in the same manner as in the foregoing case of FIGS. 4 to 6.

Since at this time the projected part 33a is formed between the deposit-coat forming portions 24 and the power source connecting portions 31, any risk in which the electrically conducting paste or the like supplied to coat the connecting portions 31 expands over to the deposit-coat forming portions 24 can be effectively prevented from occurring.

The deposit coat 27 can be reliably formed at their forming portions 24, and it is enabled to effectively form the deposit coat 27 excellent in the deposition characteristic.

Figure 17:
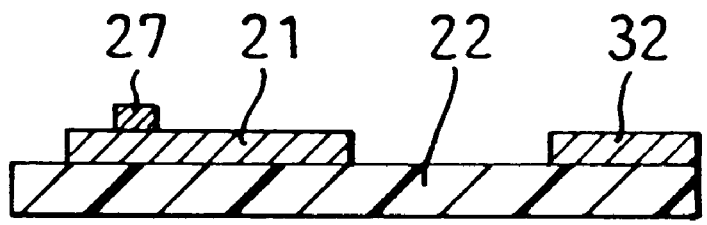
FIG. 17 is a sectioned view for explaining part of steps in another embodiment of the present invention.
Figure 18:
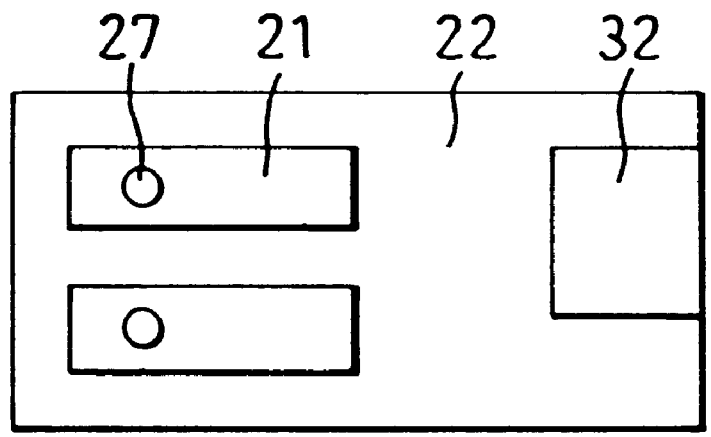
FIG. 18 is a plan view for explaining the part of the steps in the embodiment of FIG. 17.

As shown in FIGS. 17 and 18, on the other hand, the first protect layer 33 can be utilized as such permanent resist as the soldering resist in the case where the second protect layer 37 and conducting layer 35 are peeled off but the first protect layer 33 is kept remain, whereas, in the case when the permanent resist is not required, a material peelable with any one of heat, solvent and alkali is selected as the material for forming the first protect layer 33 so that the first protect layer 33 will be also peeled off together with the second protect layer 37 and conducting layer 35.

Figure 19:
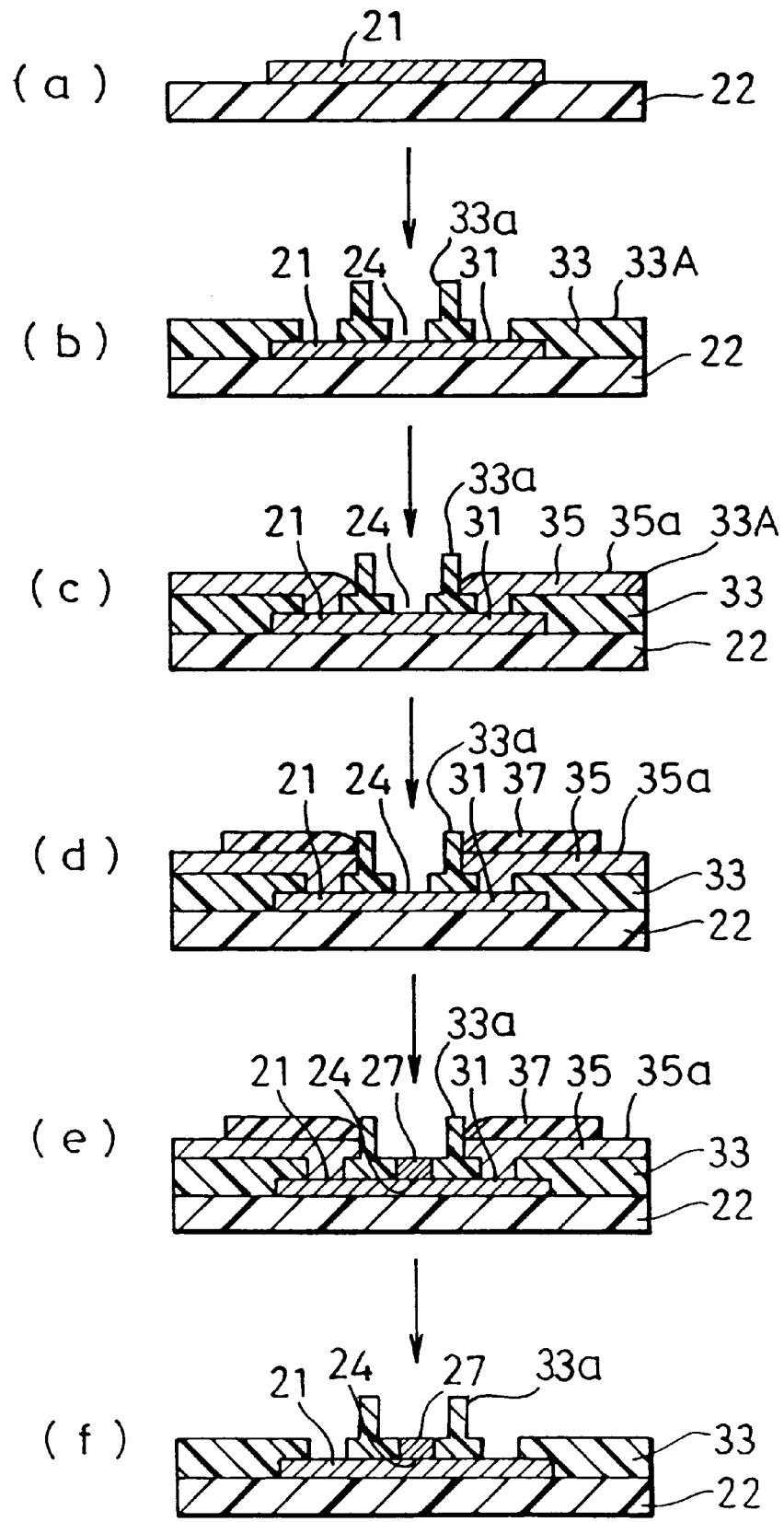
FIGS. 19(a) to 19(f) are sectioned views for explaining steps in another embodiment of the present invention.
Figure 20:
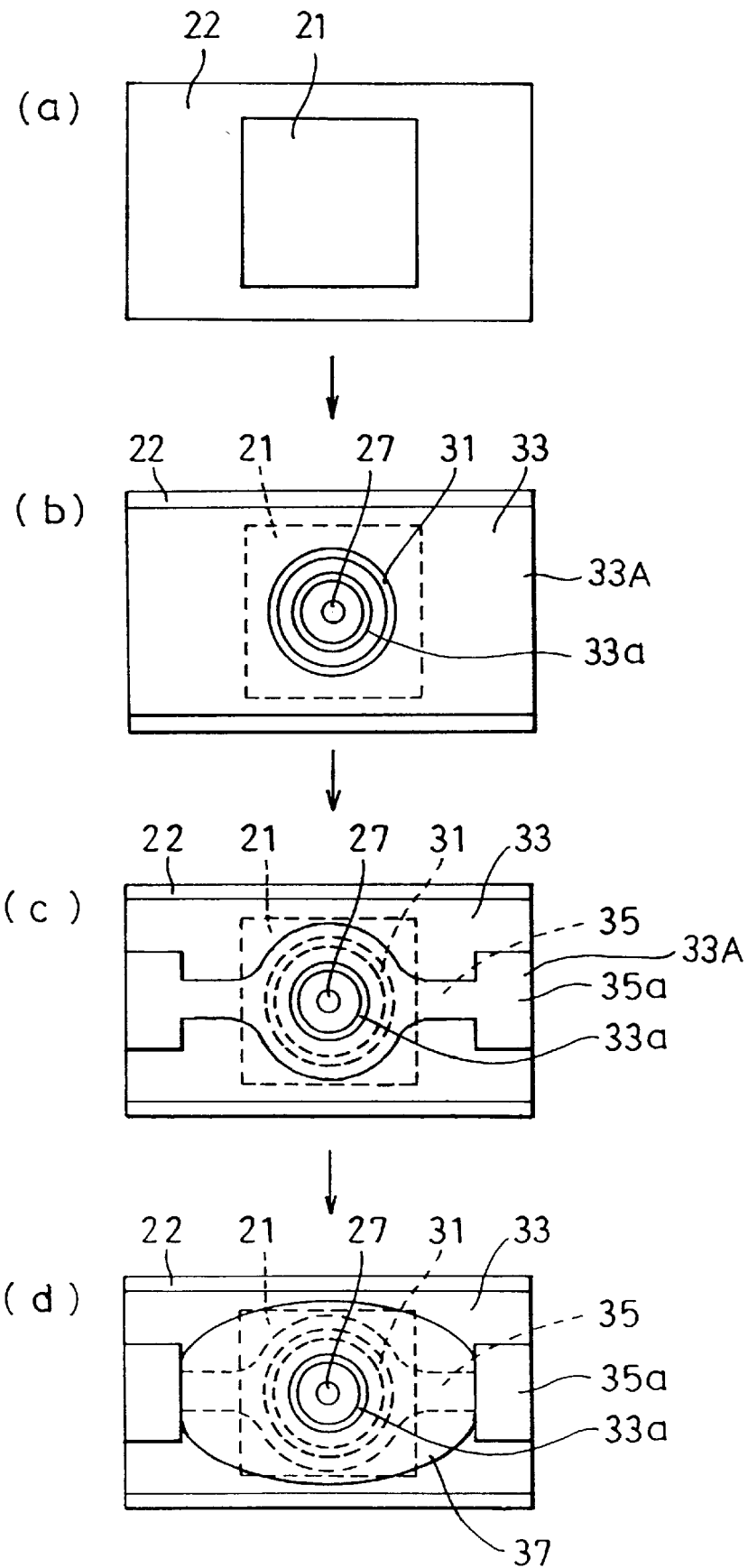
FIGS. 20(a) to 20(d) are plan views for explaining the steps in the embodiment of FIG. 19.
Figure 21:
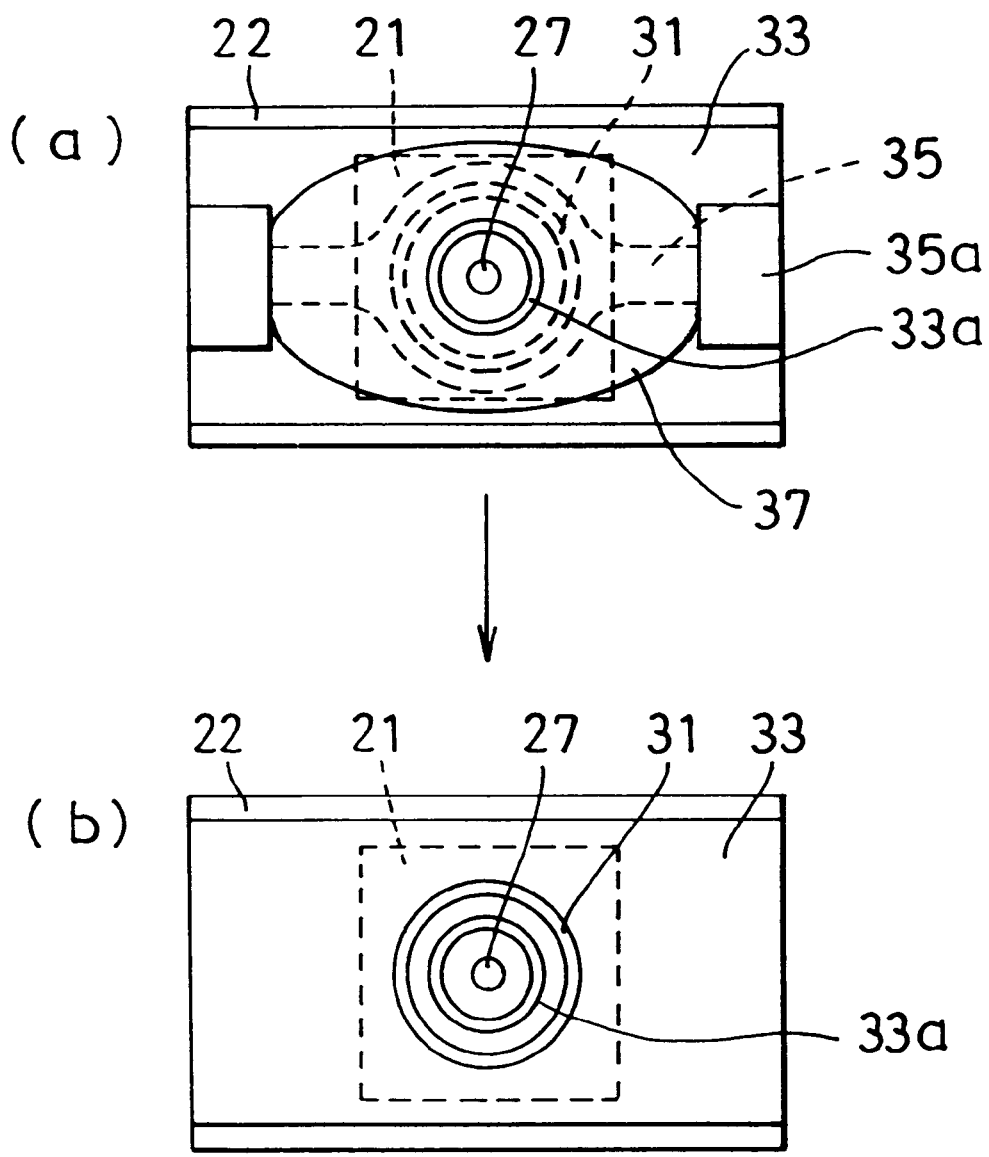
FIGS. 21(a) and 21(b) are plan views for explaining another step in the embodiment of FIG. 19.

Further, another embodiment of the present invention excellent in the deposition characteristic as a result of the electroplating is shown in FIGS. 19 to 21, in which a process employing a wiring circuit board 22 having only the isolated conductor circuit pattern 21 formed at the initial stage is employed in contrast to the foregoing embodiment of FIGS. 14 to 18. In this case, it is preferable that the projected part 33a is formed to be close to the deposit coat forming portions 24 and to be annular in plan view in the embodiment shown, while the shape may be any one which can attain the desired object and needs not be specifically limited.

Figure 22:
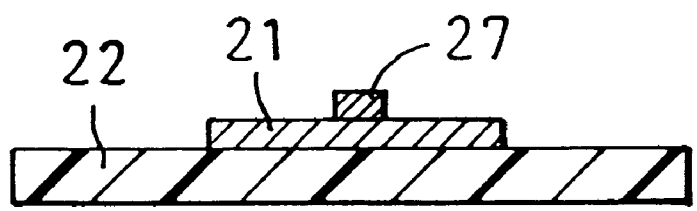
FIG. 22 shows in a sectioned view for explaining part of steps in another embodiment of the present invention.
Figure 23:
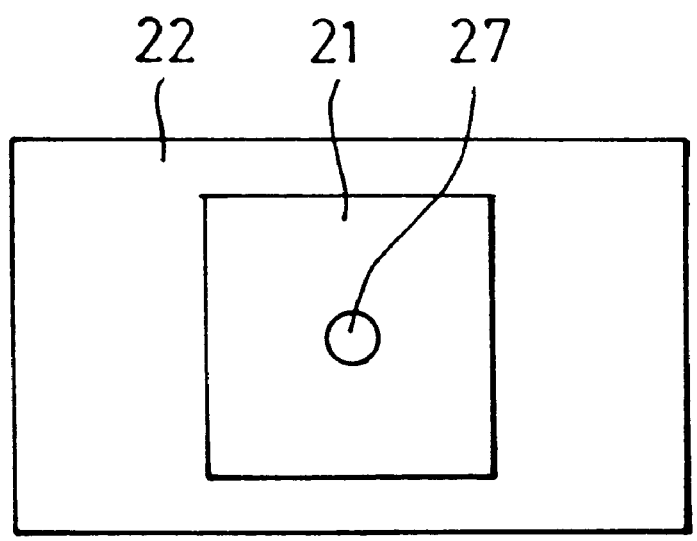
FIG. 23 is a plan view for explaining the part of the steps in the embodiment of FIG. 22.

As also shown in FIGS. 22 and 23, an arrangement in which the first protect layer 33 is peeled off together with the second protect layer 37 and conducting layer 35 likewise the case of FIGS. 7 and 8 may also be employed.

The foregoing arrangements of FIGS. 14 to 18 as well as FIGS. 19 to 23 are the same as those of FIGS. 4 to 8 and FIGS. 9 to 13, the same constituent elements as those in FIGS. 4 to 8 and FIGS. 9 to 13 are shown with the same reference numbers in FIGS. 14 to 18 and FIGS. 19 to 23, and the same function and effect can be attained.

Figure 24:
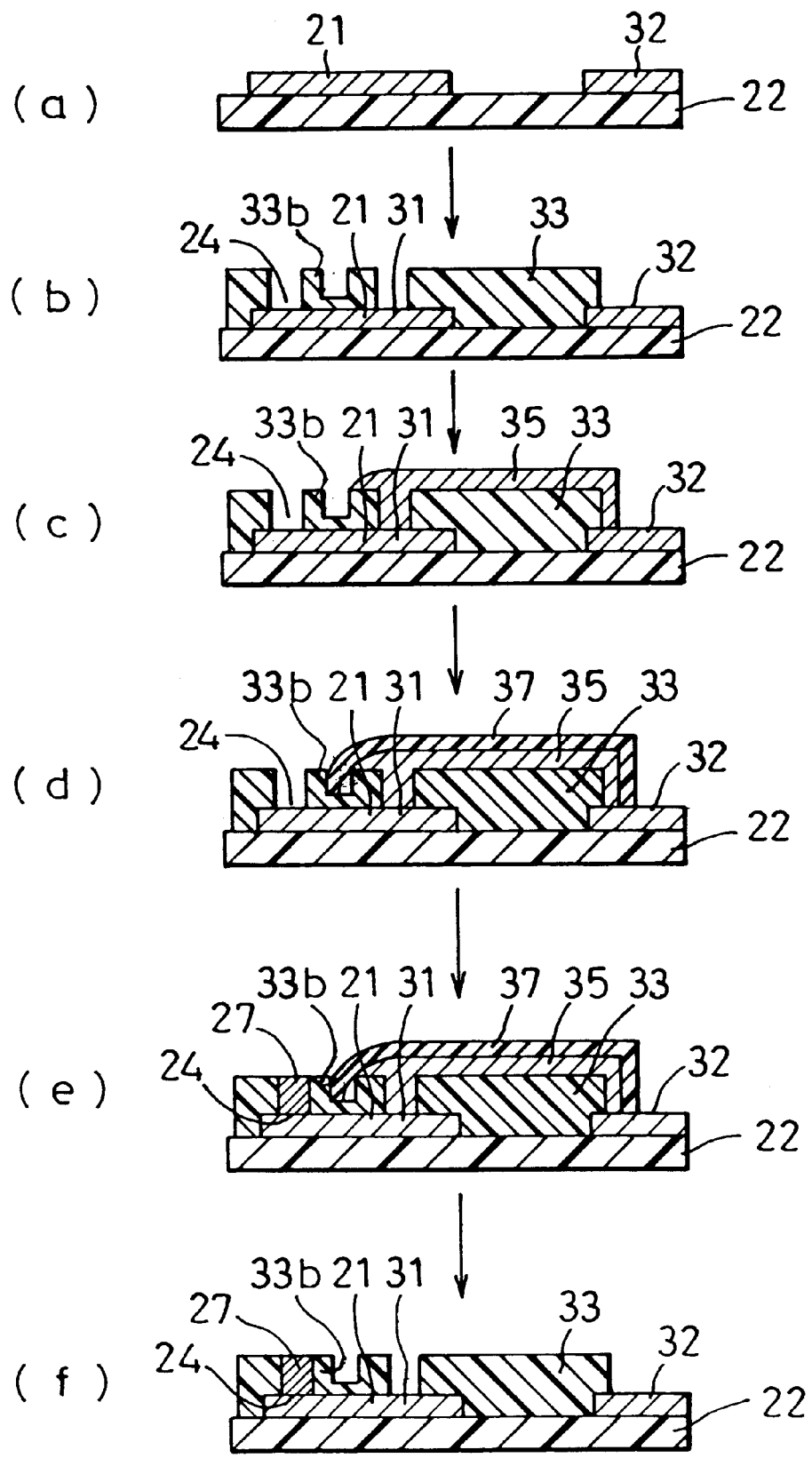
FIGS. 24(a) to 24(f) are sectioned views for explaining steps in another embodiment of the present invention.

In still another embodiment shown in FIG. 24, the wiring circuit board 22 provided on the surface with the isolated conductor circuit pattern 21 and with the power supply terminal 32 formed as separated from the circuit pattern 21 is further provided with a projection 33b formed between the circuit pattern 21 and the terminal 32 and to have a recess in top face, whereby the same function as the projected part 33a of FIGS. 14 to 18 can be realized by this projection 33b.

Figure 25:
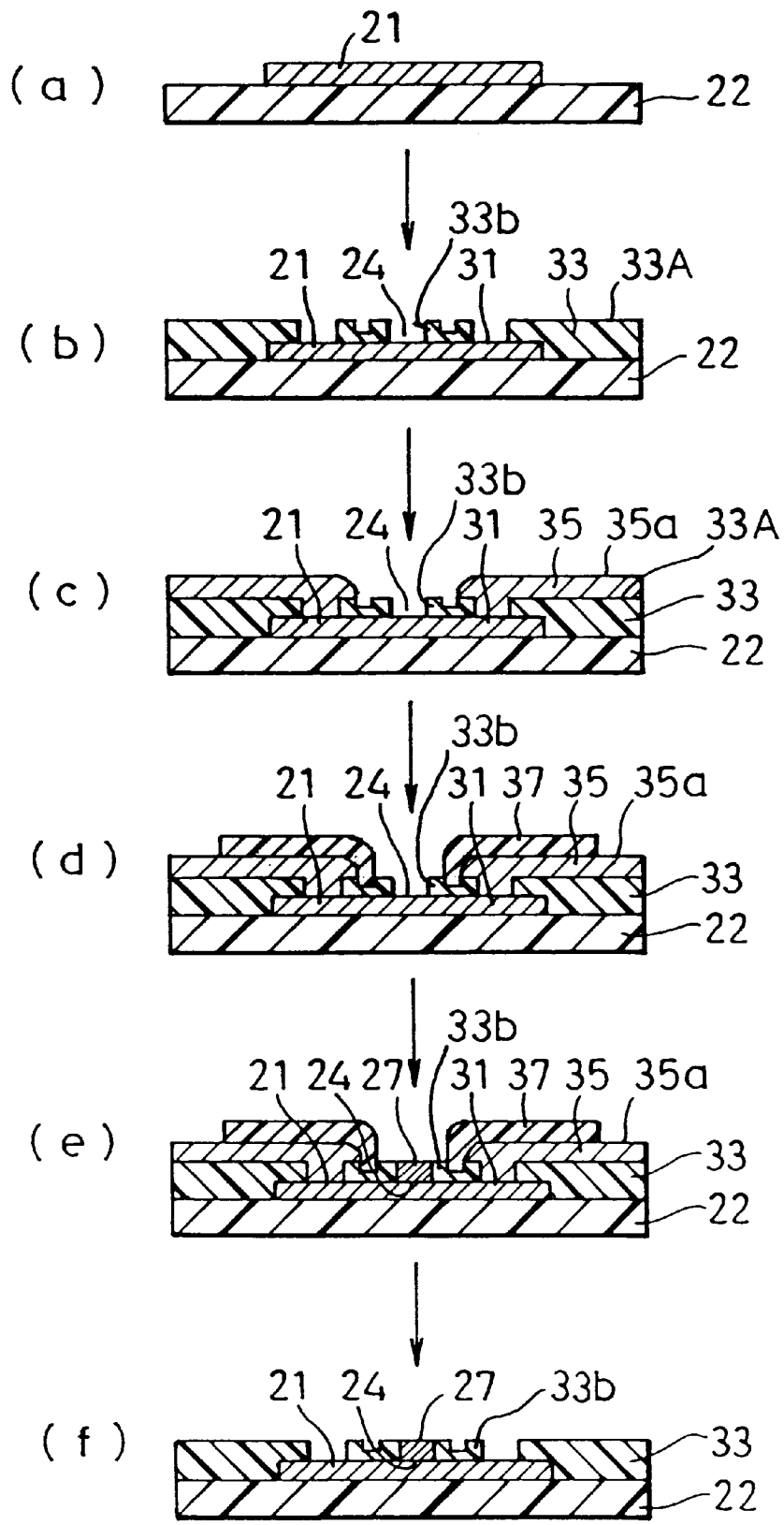
FIGS. 25(a) to 25(f) are sectioned views for explaining steps in another embodiment of the present invention.

In another embodiment shown in FIG. 25, the projection 33b having the recess in the top face is formed to be annular in the plan view, on the wiring circuit board 22 carrying only the isolated conductor circuit pattern 21 formed at the initial stage, whereby the same function as the projected part 33a of FIGS. 19 to 23 can be realized.

All other aspects of the foregoing arrangements of FIGS. 24 and 25 are the same as those in FIGS. 4 to 8 and 14 to 18 and FIGS. 9 to 13 and 19 to 23, and the same constituent elements are shown in FIGS. 24 and 25 with the same reference numbers as those in the foregoing embodiments.

What is claimed is:

1. A process of plating on isolated conductor circuit pattern wherein a deposit is formed through an electroplating on an isolated conductor circuit pattern of wiring circuit board, characterized in comprising the steps of forming on the wiring circuit board an electrically conducting layer consisting of a material electrically conducting and peelable with one of heat, solvent and alkali, so as to be at least in contact with the isolated conductor circuit pattern on which a deposit coat is to be formed; forming a peelable protect layer on at least a portion of the electrically conducting layer other than a portion on which the deposit coat is to be formed and to be superposed on the electrically conducting layer; causing a metal to deposit on a portion not coated by the protect layer through an electroplating performed with the electrically conducting layer used as a power supply layer; and peeling off the electrically conducting layer and the protect layer left on the wiring circuit board.

2. The process according to claim 1 wherein the protect layer is photosensitive, said photosensitive protect layer being formed at the portion where the deposit coat is to be formed and removed through an exposure to light and development.

3. The process according to claim 1 wherein the electrically conducting layer is of a photosensitive material.

4. The process according to claim 1 wherein the electrically conducting layer contains an electrically conducting filler.

5. The process according to claim 4 wherein the electrically conducting filler is at least one selected from the group consisting of carbon, copper and silver.

6. A process of plating on isolated conductor circuit pattern formed on a wiring circuit board to form a deposit coat through an electroplating, characterized in comprising the steps of:

(a) forming an electrically insulating first protect layer on the wiring circuit board, to coat the whole surface of the isolated conductor circuit pattern except a deposit-coat forming portion and a power source connecting portion, and to reach a portion of the surface of the board to which portion a power is to be supplied;

(b) forming an electrically conducting layer consisting of an electrically conducting material and peelable with one of heat, solvent and alkali on the surfaces of the first protect layer and of the portion to which the power is to be supplied, to coat the power source connecting portion and the portion to which the power is to be supplied and to conduct between the power source connecting portion and the portion to which the power is to be supplied while exposing the deposit-coat forming portion;

(c) forming a second protect layer consisting of a material electrically insulating and peelable with one of heat, solvent and alkali, to coat the whole surfaces of portions of the electrically conducting layer formed on the first protect layer and on the power source connecting portion while exposing the deposit-coat forming portion;

(d) forming a deposit coat at the deposit-coat forming portion on the isolated conductor circuit pattern through an electroplating performed with a power supplied to the portion to which the power is to be supplied; and (e) peeling off the second protect layer and electrically conducting layer.

7. The process according to claim 6 wherein the step (a) includes a step of forming preliminarily the power supply terminal by separating the electrically insulating first protect layer from the isolated conductor circuit pattern, and the step (b) includes a step of coating the power source connecting portion and the preliminarily formed power supply terminal and conducting between them with a peelable material layer.

8. The process according to claim 6 wherein a photosensitive material is used as the material for forming the first protect layer.

9. The process according to claim 6 wherein a material which forms a substance peelable with one of heat, solvent and alkali is used as the material for forming the first protect layer.

10. The process according to claim 6 wherein, at the step (b), the electrically conducting layer is formed by applying an electrically conducting paste prepared by mixing an electrically conducting filler with a resin and hardening the applied paste.

11. The process according to claim 10 wherein a phenolic resin that forms a hardened substance peelable with alkali is used as the resin contained in the electrically conducting paste.

12. The process according to claim 10 wherein at least one selected from the group consisting of carbon powder, copper powder and silver powder is employed as the electrically conducting filler contained in the electrically conducting paste.

13. The process according to claim 6 wherein, at the step (c), the second protect layer is formed by applying an electrically insulating paste containing a resin, and hardening the applied paste.

14. The process according to claim 13 wherein a phenolic resin that forms a hardened substance peelable with alkali is used as the resin contained in the electrically insulating paste.

15. The process according to claim 6 wherein the step (a) includes a step of forming a projected part between the deposit-coat forming portion and the power source connecting portion, while forming the first protect layer.

16. The process according to claim 15 wherein the step (a) includes a step of forming a projected part so as to encircle the deposit-coat forming portion.

17. The process according to claim 6 wherein the step (a) includes a step of forming a recess between the deposit-coat forming portion and the power source connecting portion, while forming the first protect layer.

18. The process according to claim 17 wherein the step (a) includes a step of forming a recess so as to encircle the deposit-coat forming portion.

* * * * *